(12) United States Patent
Kim

(10) Patent No.: US 10,431,673 B2
(45) Date of Patent: Oct. 1, 2019

(54) SEMICONDUCTOR DEVICES

(71) Applicant: Samsung Electronics Co., Ltd., Suwon-si, Gyeonggi-do (KR)

(72) Inventor: Ju Youn Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 32 days.

(21) Appl. No.: 15/842,050

(22) Filed: Dec. 14, 2017

(65) Prior Publication Data

US 2018/0358450 A1 Dec. 13, 2018

(30) Foreign Application Priority Data

Jun. 9, 2017 (KR) ........................ 10-2017-0072389

(51) Int. Cl.
*H01L 29/06* (2006.01)
*H01L 29/66* (2006.01)
(Continued)

(52) U.S. Cl.
CPC ...... *H01L 29/6681* (2013.01); *H01L 29/0649* (2013.01); *H01L 29/41791* (2013.01);
(Continued)

(58) Field of Classification Search
CPC ............. H01L 29/6681; H01L 29/6653; H01L 29/66553; H01L 29/6656; H01L 29/66689; H01L 29/66719; H01L 29/41791; H01L 29/42312; H01L 29/42316; H01L 29/42336; H01L 29/0642; H01L 29/0649; H01L 29/0653; H01L 29/785; H01L 29/1075; H01L 27/088; H01L 27/105; H01L 27/10826; H01L 27/10876; H01L 27/10879; H01L 21/02063; H01L 21/02065; H01L 21/76283; H01L 21/76291; H01L 21/765; H01L 21/8238; H01L 21/823821; H01L 21/823828; H01L 21/845; H01L 21/823468; H01L 21/823864; H01L 29/7851; H01L 29/66545; H01L 29/66795; H01L 27/0886; H01L 21/823481; H01L 21/823878; H01L 21/02074
(Continued)

(56) References Cited

U.S. PATENT DOCUMENTS 6,970,372 B1 11/2005 Furukawa et al.
7,602,021 B2 10/2009 Doris et al.
(Continued)

*Primary Examiner* — Natalia A Gondarenko
(74) *Attorney, Agent, or Firm* — Harness, Dickey & Pierce, P.L.C.

(57) ABSTRACT

A semiconductor device includes a fin protruding from a substrate and extending in a first direction, source/drain regions on the fin, a recess between the source/drain regions, a device isolation region including a capping layer extending along an inner surface of the recess and a device isolating layer on the capping layer to fill the recess, a dummy gate structure on the device isolation region and including a dummy gate insulating layer, outer spacers on opposite sidewalls of the dummy gate structure, first inner spacers between the dummy gate structure and the outer spacers, and a second inner spacer between the device isolation region and the dummy gate insulating layer.

20 Claims, 25 Drawing Sheets

(51) Int. Cl.
*H01L 29/78* (2006.01)
*H01L 29/417* (2006.01)
*H01L 29/165* (2006.01)

(52) U.S. Cl.
CPC ...... *H01L 29/66545* (2013.01); *H01L 29/785* (2013.01); *H01L 29/165* (2013.01); *H01L 29/7848* (2013.01)

(58) Field of Classification Search
USPC .............................. 257/365, 357, 374, 369
See application file for complete search history.

(56) References Cited

U.S. PATENT DOCUMENTS

| | | | |
|---|---|---|---|
| 7,898,037 B2 | 3/2011 | Chuang et al. | |
| 8,076,190 B2 | 12/2011 | Chen et al. | |
| 8,080,838 B2 | 12/2011 | Chang et al. | |
| 8,362,572 B2 | 1/2013 | Huang et al. | |
| 8,598,641 B2 | 12/2013 | Chen et al. | |
| 8,642,416 B2 | 2/2014 | Or-Bach et al. | |
| 8,693,235 B2 | 4/2014 | Liaw | |
| 8,697,539 B2 | 4/2014 | Huang et al. | |
| 8,723,225 B2 | 5/2014 | Hu et al. | |
| 8,848,423 B2 | 9/2014 | Chung | |
| 8,866,235 B2 | 10/2014 | Wu et al. | |
| 8,952,547 B2 | 2/2015 | Liaw | |
| 9,035,306 B2 | 5/2015 | Hoentschel et al. | |
| 9,111,801 B2 | 8/2015 | Zhang | |
| 9,117,910 B2 * | 8/2015 | Jeong | H01L 29/7855 |
| 9,171,752 B1 | 10/2015 | Wu et al. | |
| 9,209,201 B2 | 12/2015 | Lin et al. | |
| 9,299,700 B2 | 3/2016 | Park et al. | |
| 9,362,181 B1 | 6/2016 | Xie et al. | |
| 9,368,502 B2 | 6/2016 | Chang et al. | |
| 9,395,489 B2 | 7/2016 | Cheng et al. | |
| 9,397,101 B2 | 7/2016 | Chintarlapalli Reddy et al. | |
| 9,418,189 B2 | 8/2016 | Lin et al. | |
| 9,478,641 B2 | 10/2016 | Huang et al. | |
| 9,515,172 B2 | 12/2016 | Shin et al. | |
| 9,530,777 B2 | 12/2016 | Loubet et al. | |
| 9,536,882 B2 | 1/2017 | Anderson et al. | |
| 9,536,964 B2 | 1/2017 | Shiao et al. | |
| 9,548,109 B2 | 1/2017 | Chung | |
| 2015/0021710 A1 | 1/2015 | Hsu et al. | |
| 2015/0325575 A1 * | 11/2015 | Park | H01L 29/0653 257/401 |
| 2016/0276429 A1 | 9/2016 | Tseng et al. | |
| 2016/0380052 A1 | 12/2016 | Kim et al. | |
| 2017/0025540 A1 * | 1/2017 | Liou | H01L 29/7851 |

\* cited by examiner

SEMICONDUCTOR DEVICES

CROSS-REFERENCE TO RELATED APPLICATION

This U.S. non-provisional application claims the benefit of priority under 35 U.S.C. § 119 to Korean Patent Application No. 10-2017-0072389, filed on Jun. 9, 2017 in the Korean Intellectual Property Office (KIPO), the disclosure of which is hereby incorporated by reference in its entirety.

TECHNICAL FIELD

Various example embodiments of the inventive concepts relate to semiconductor devices.

BACKGROUND

To increase the integration of a semiconductor device, such as multi-gate transistors including a fin-type multi-channel active pattern (and/or silicon body) on a substrate and a gate on the multi-channel active pattern have been proposed.

Since a multi-gate transistor can utilize a three-dimensional channel, it can be scaled. Further, current control capability can be improved without increasing a gate length of the multi-gate transistor. A short channel effect (SCE) that the electrical potential of the channel region is effected by the drain voltage can be effectively reduced and/or suppressed in the multi-gate transistor.

SUMMARY

According to some example embodiments of the inventive concepts, a semiconductor device may include at least one fin protruding from a substrate and extending in a first direction, a plurality of source/drain regions on the fin, a recess region being between the plurality of source/drain regions, a device isolation region including a capping layer and a device isolating layer, the capping layer extending along an inner surface of the recess region and the device isolating layer on the capping layer to fill the recess region, a dummy gate structure on the device isolation region, the dummy gate structure extending in a second direction different from the first direction, and the dummy gate structure including a dummy gate insulating layer, a plurality of outer spacers on opposite sidewalls of the dummy gate structure, a plurality of first inner spacers being between the dummy gate structure and the plurality of outer spacers, and a second inner spacer being between the device isolation region and the dummy gate insulating layer.

According to some example embodiments of the inventive concepts, a semiconductor device may include at least one fin protruding from a substrate and extending in a first direction, a first gate structure and a second gate structure on the fin and extending in a second direction intersecting the first direction, a recess region, on the fin, and being between the first gate structure and the second gate structure, a device isolation region in the recess region, a plurality of outer spacers being between the first gate structure and the second gate structure, a plurality of first inner spacers on corresponding sidewalls of the outer spacers, a second inner spacer connecting the plurality of first inner spacers, and a dummy gate structure being between the plurality of outer spacers and on the plurality of first inner spacers and the second inner spacer. The dummy gate structure may include a first portion and a second portion, the first portion being between the plurality of first inner spacers, and the second portion on the first portion and upper surfaces of the plurality of first inner spacers.

According to some example embodiments of the inventive concepts, a semiconductor device may include at least one fin protruding from a substrate and extending in a first direction, a first gate structure and a second gate structure on the fin, the first gate structure and the second gate structure both extending in a second direction intersecting the first direction, a recess region on the fin and being between the first gate structure and the second gate structure, a device isolation layer in the recess region, a dummy gate structure on the device isolation layer and including a dummy gate insulating layer, a plurality of outer spacers on opposite sidewalls of the dummy gate structure, and a dielectric layer including a plurality of first parts, a second part, and a third part, the plurality of first parts each on portions of corresponding sidewalls of the plurality of outer spacers, the second part being between the device isolation layer and the dummy gate insulating layer and connected to the plurality of first parts, and the third part being between the device isolation layer and an inner surface of the recess region.

DETAILED DESCRIPTION

Figure 1:
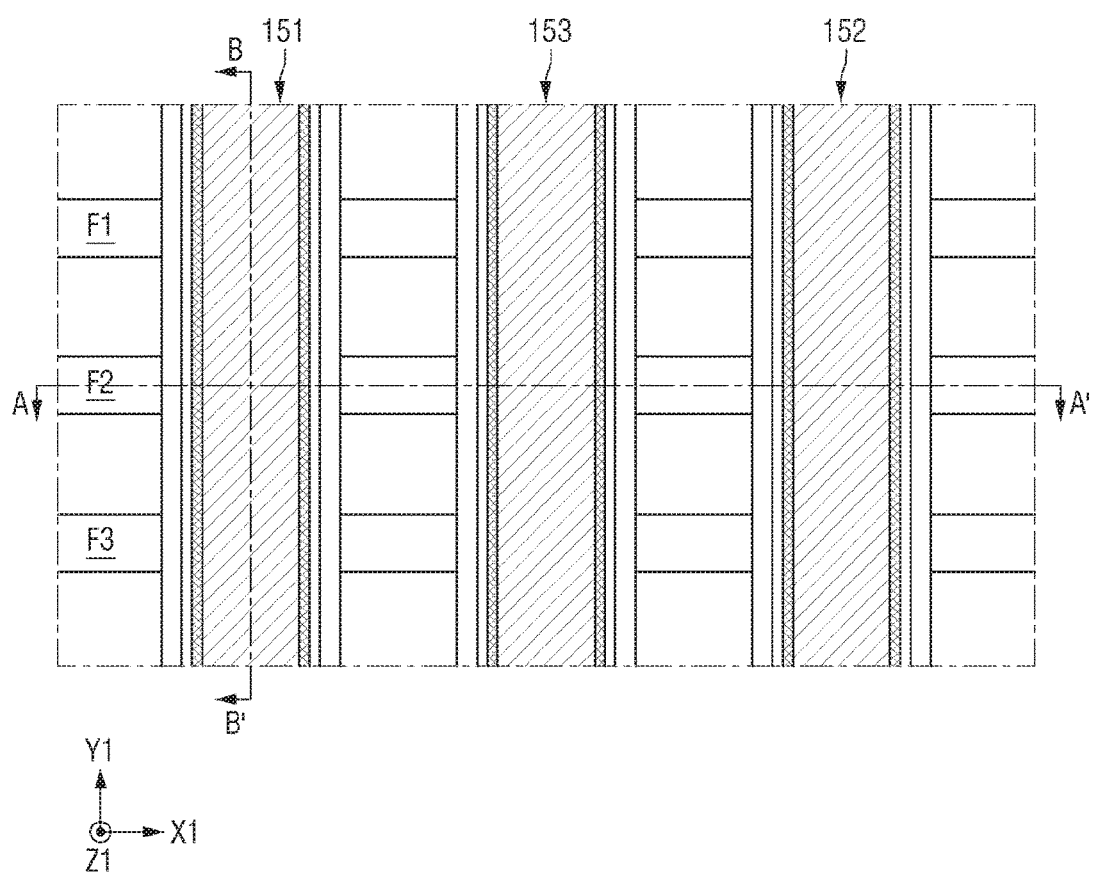
FIG. 1 is a layout diagram illustrating a semiconductor device according to some example embodiments.
Figure 2:
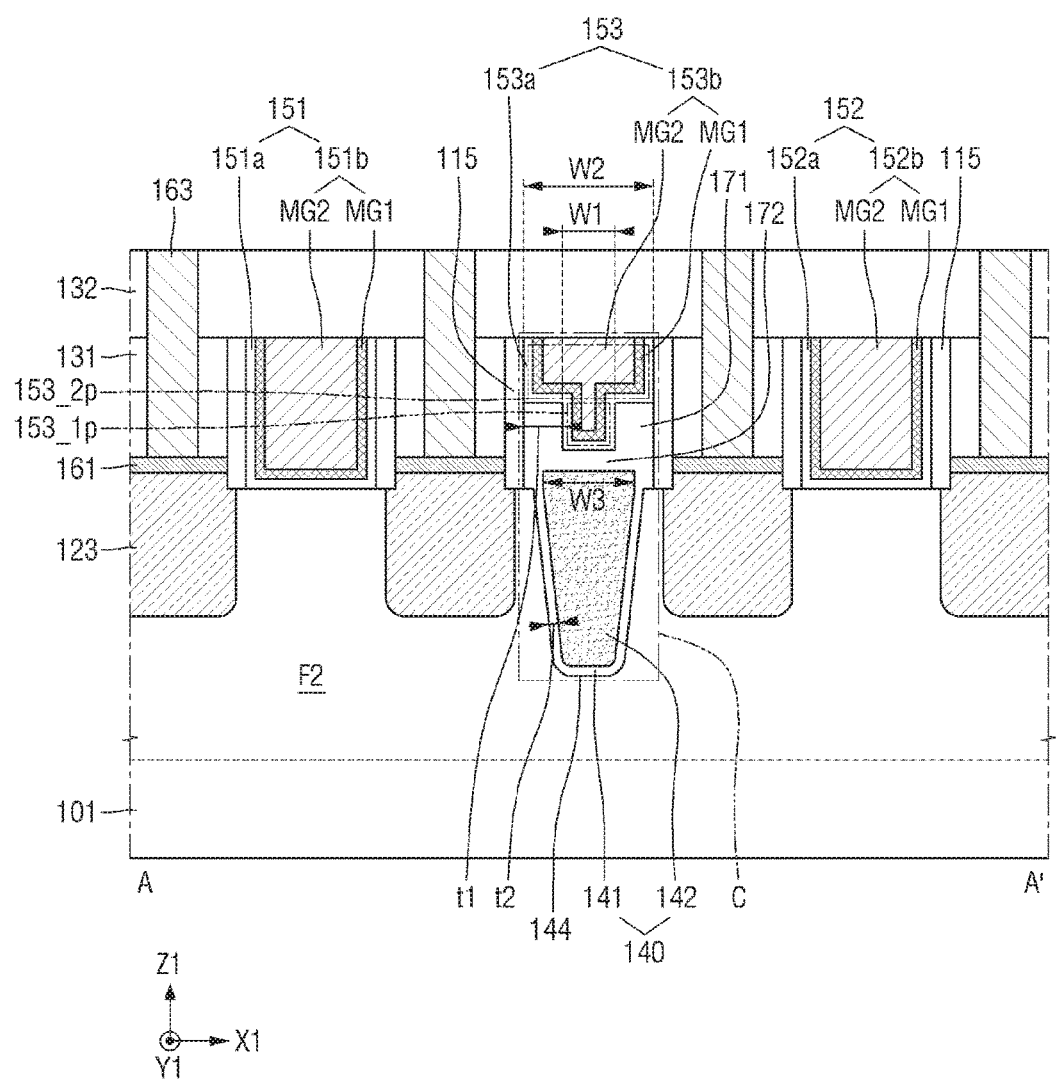
FIG. 2 is a cross-sectional view taken along line A-A' of FIG. 1, illustrating a semiconductor device according to some example embodiments.
Figure 3A:
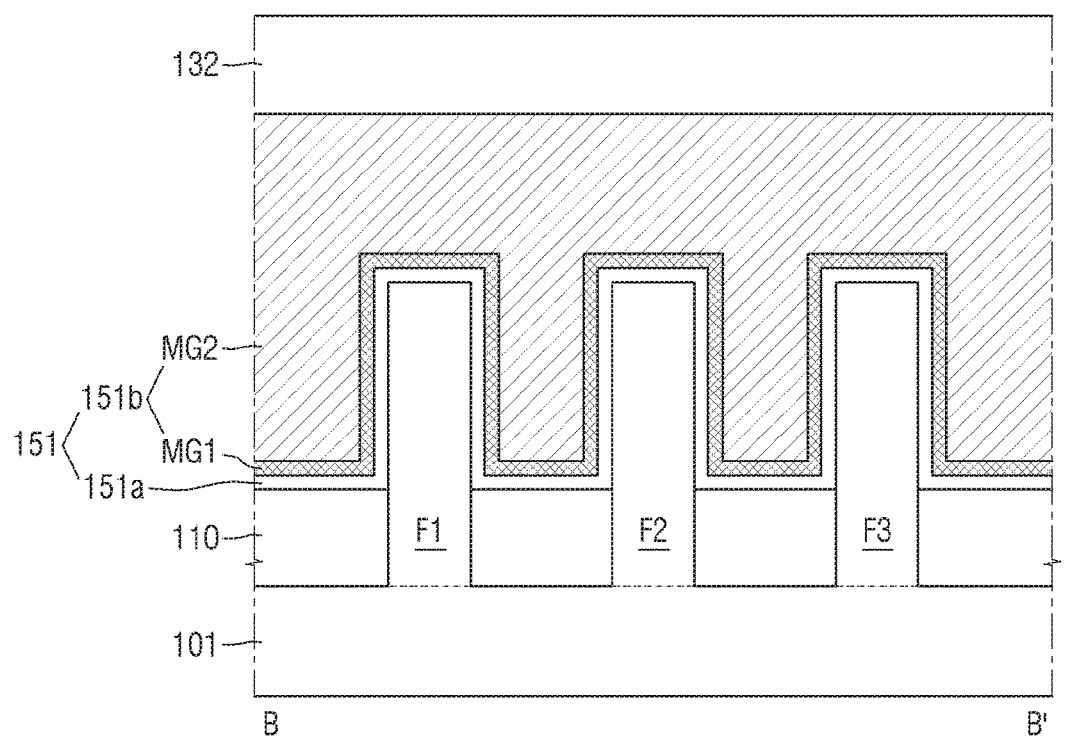
FIG. 3A is a cross-sectional view taken along line B-B' of FIG. 1, illustrating a semiconductor device according to some example embodiments.
Figure 3A:
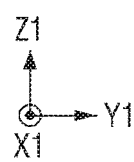
Figure 3B:
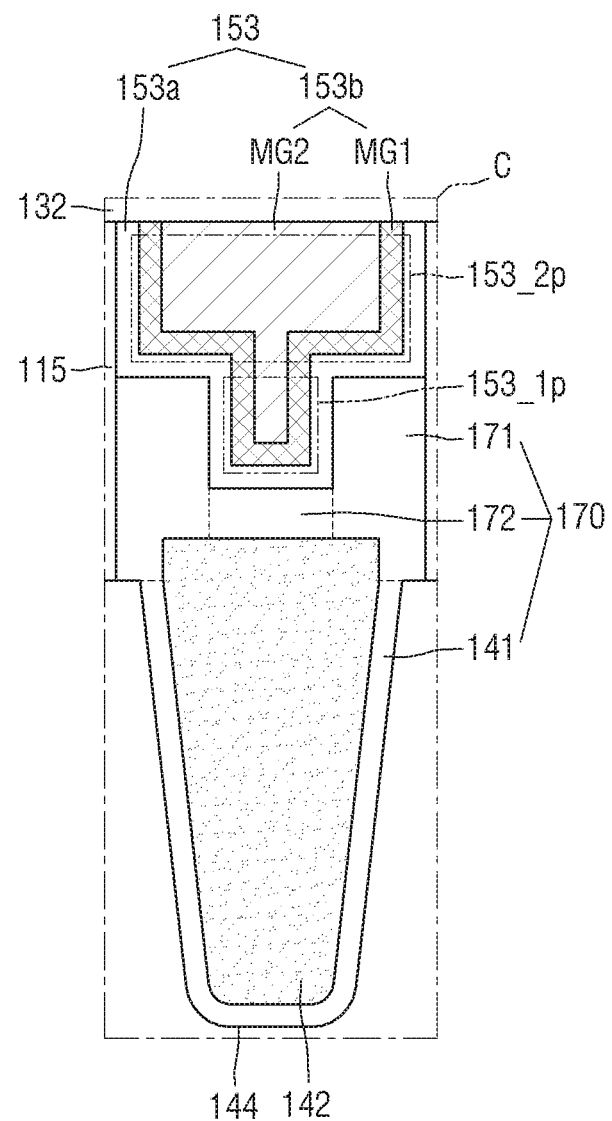
FIG. 3B is an enlarged view of portion C of FIG. 2.

FIG. 1 is a layout diagram illustrating a semiconductor device according to some example embodiments. FIG. 2 is a cross-sectional view taken along line A-A' of FIG. 1, illustrating a semiconductor device according to some example embodiments. FIG. 3A is a cross-sectional view taken along line B-B' of FIG. 1, illustrating a semiconductor device according to some example embodiments. FIG. 3B is an enlarged view of portion C of FIG. 2. In FIG. 1, first and second interlayer insulating layers 131 and 132 and a contact 163 are not illustrated for brevity.

FIGS. 1, 2, 3A and 3B, a semiconductor device may include a substrate 101, a plurality of fins, e.g., first, second, and third fins F1, F2, and F3, a field insulating layer 110, outer spacers 115, source/drain regions 123, the first and second interlayer insulating layers 131 and 132, a device isolation region 140, a first recess 144, a plurality of gate structures, e.g., first and second gate structures 151 and 152, a dummy gate structure 153, a silicide layer 161, the contact 163, and a plurality of inner spacers, e.g., first and second inner spacers 171 and 172, but the example embodiments are not limited thereto.

The substrate 101 may include a semiconductor material, for example, Si, Ge, SiGe, GaP, GaAs, SiC, SiGeC, InAs, and/or InP. The substrate 101 may be a silicon on insulator (SOI) substrate.

The first to third fins F1, F2, and F3 may protrude from the substrate 101 in a third direction, e.g., Z1, perpendicular to an upper surface of the substrate 101, but the example embodiments are not limited thereto. The first to third fins F1, F2, and F3 may extend in respective length directions, for example, a first direction X1 parallel to the upper surface of the substrate 101. The first to third fins F1, F2, and F3 may each have a short side and a long side. The first to third fins F1, F2, and F3 may be arranged spaced apart from one another on the substrate 101. For example, the first to third fins F1, F2, and F3 may be spaced apart from one another in a second direction, e.g., Y1, parallel to the upper surface of the substrate 101 and perpendicular to the first direction X1. As shown in FIG. 1, a long side direction of the first to third fins F1, F2, and F3 may be the first direction X1 and a short side direction thereof may be the second direction Y1, but the example embodiments are not limited thereto. For example, the long side direction of the first to third fins F1, F2, and F3 may be the second direction Y1 and the short side direction thereof may be the first direction X1.

The first to third fins F1, F2, and F3 may be a portion of the substrate 101 and may each include an epitaxial layer grown from the substrate 101. The first to third fins F1, F2, and F3 may include, for example, Si or SiGe, etc.

The field insulating layer 110 may be disposed on the substrate 101. The field insulating layer 110 may be disposed between first to third fins F1, F2, and F3. The field insulating layer 110 may cover portions of the first to third fins F1, F2, and F3. For example, the field insulating layer 110 may cover portions of sidewalls of the first to third fins F1, F2, and F3.

The first to third fins F1, F2, and F3 may protrude above an upper surface of the field insulating layer 110 between each of the long sides of the first to third fins F1, F2, and F3. The first to third fins F1, F2, and F3 may be defined by the field insulating layer 110 on the substrate 101, but the example embodiments are not limited thereto.

The field insulating layer 110 may include and/or may be formed from, for example, silicon oxide, silicon nitride, and/or silicon oxynitride, etc.

The first gate structure 151, the second gate structure 152, and the dummy gate structure 153 may be arranged spaced apart from one another. The first gate structure 151, the second gate structure 152, and the dummy gate structure 153 may intersect the first to third fins 1, F2, and F3. The dummy gate structure 153 may be disposed on the device isolation region 140. As shown in FIG. 1, the first gate structure 151, the second gate structure 152, and the dummy gate structure 153 may extend in the second direction Y1, but the example embodiments are not limited thereto. In some example embodiments, the first gate structure 151, the second gate structure 152, and the dummy gate structure 153, may intersect first to third fins F1, F2, and F3, while forming an acute angle or an obtuse angle with the long sides of the first to third fins F1, F2, and F3.

The first recess 144 (e.g., the first recess region) aligned in the second direction Y1 may be formed in each of the first to third fins F1, F2, and F3. The first recess 144 may be disposed between the source/drain regions 123 associated with a semiconductor device, and may be spaced apart from the source/drain regions 123 of the semiconductor device. Thus, the device isolation region 140 in the first recess 144 may be spaced apart from the source/drain regions 123.

A bottom surface of the first recess 144 may be substantially coplanar with or lower than lower surfaces of the source/drain regions 123 with respect to the upper surface of the substrate 101. According to some example embodiments, a surface of the semiconductor device may be substantially coplanar in relation to and/or in comparison with another surface of the semiconductor if the two surfaces are within approximately +/−10% of the vertical height and/or depth of the two surfaces if being viewed as a cross-section. As shown in FIG. 2, the first recess 144 may be a tapered trench, but the example embodiments are not limited thereto. In some example embodiments, the first recess 144 may be U-shaped, V-shaped, rectangular, trapezoidal, rounded, etc.

The first and second gate structures 151 and 152 may extend in the second direction Y1. The first and second gate structures 151 and 152 may be formed on the first to third fins F1, F2, and F3, and may intersect the first to third fins F1, F2, and F3. The first and second gate structures 151 and 152 may be disposed spaced apart from each other in the first direction X1.

The first gate structure 151 may include a first gate insulating layer 151a and a first gate electrode 151b, but is not limited thereto. The second gate structure 152 may include a second gate insulating layer 152a and a second gate electrode 152b, but is not limited thereto.

The first gate insulating layer 151a may be interposed between the first gate electrode 151b and the first to third fins F1, F2, and F3, but is not limited thereto. The second gate insulating layer 152a may be interposed between the second gate electrode 152b and the first to third fins F1, F2, and F3, but is not limited thereto. The first gate insulating layer 151a and the second gate insulating layer 152a may be disposed on upper surfaces of the first to third fins F1, F2, and F3 and upper portions of sidewalls of the first to third fins F1, F2, and F3, but are not limited thereto. The first gate insulating layer 151a may be interposed between the first gate electrode 151b and the field insulating layer 110. The second gate insulating layer 152a may be interposed between the second gate electrode 152b and the field insulating layer 110.

The first gate electrode 151b and the second gate electrode 152b may each include one or more metal layers, such as first metal layer MG1 and a second metal layer MG2. The first gate electrode 151b and the second gate electrode 152b may each include the first metal layer MG1 and the second metal layer MG2 of two or more layers. The first metal layer MG1 may function as a work function adjusting layer, but is not limited thereto. The second metal layer MG2 may fill a space delimited by the first metal layer MG2, but is not limited thereto. For example, the first metal layer MG1 may be conformally formed along an upper surface of the field insulating layer 110 and on the upper surfaces and the upper sidewalls of the first to third fins F1, F2, and F3. The first metal layer MG1 may include, for example, TiN, TaN, TiAlC, and/or TaC, etc. The second metal layer MG2 may include, for example, W and/or Al, etc. In some example embodiments, the first and second gate electrodes 151b and 152b may include, for example, Si and/or SiGe, but not metal.

The first gate structure 151 and the second gate structure 152 may be formed by, for example, a replacement process, but the example embodiments are not limited thereto.

The dummy gate structure 153 may extend in a second direction Y1. The dummy gate structure 153 may be formed on the first to third fins F1, F2, and F3, and may intersect the first to third fins F1, F2, and F3. The dummy gate structure 153 may be disposed between the first gate structure 151 and the second gate structure 152 and may be spaced apart from the first and second gate structures 151 and 152 in the first direction X1.

The dummy gate structure 153 may be disposed on the device isolation region 140. For example, the dummy gate structure 153 may be disposed on the first inner spacers 171 and the second inner spacer 172 and between the outer spacers 115, but is not limited thereto.

The dummy gate structure 153 may include a first portion 153_1p between the first inner spacers 171, for example in a space defined by the first inner spacers 171 and the second inner spacer 172, and a second portion 153_2p on the first portion 153_1p and upper surfaces of the first inner spacers 171. A sidewall of the first portion 153_1p of the dummy gate structure 153 may contact the first inner spacers 171, and a lower surface of the first portion 153_1p of the dummy gate structure 153 may contact the second inner spacer 172. A sidewall of the second portion 153_2p of the dummy gate structure 153 may contact the outer spacers 115, and an upper surface of the second portion 153_2p of the dummy gate structure 153 may contact the second interlayer insulating layer 132.

According to some example embodiments, a width W2 of the second portion 153_2p of the dummy gate structure 153 may be greater than a width W1 of the first portion 153_1p thereof, but the example embodiments are not limited thereto and the widths W2 and W1 may be the same, or the width W1 may be greater than the width W2. For example, in some example embodiments, the width W2 of the second portion 153_2p of the dummy gate structure 153 may be substantially equal to a width W1 of the first portion 153_1p thereof.

The dummy gate structure 153 may include a dummy gate insulating layer 153a and a dummy gate electrode 153b. The dummy gate structure 153 may not function as a gate of a transistor, unlike the first and second gate strictures 151 and 152. The dummy gate structure 153 may be used as a local interconnection for connecting gate electrodes of transistors arranged in the second direction Y1.

The dummy gate insulating layer 153a may be disposed between the dummy gate electrode 153b and the first to third fins F1, F2, and F3. The dummy gate insulating layer 153a may be disposed on the device isolation region 140.

The dummy gate electrode 153b may include one or more metal layers, such as the first metal layer MG1 and the second metal layer MG2. The dummy gate electrode 153b may include the first metal layer MG1 and the second metal layer MG2 of two or more layers. The first metal layer MG1 may include, for example, TiN, TaN, TiC, TiAlC, and/or TaC, etc. The second metal layer MG2 may include, for example, W and/or Al, etc. In some example embodiments, the dummy gate electrode 153b may include, for example, Si and/or SiGe, but not metal. The dummy gate structure 153 may be formed by, for example, by a replacement process, but the example embodiments are not limited thereto.

The first gate insulating layer 151a, the second gate insulating layer 152a, and the dummy gate insulating layer 153a may include a high-k dielectric material having a dielectric constant higher than silicon oxide.

The first gate insulating layer 151a, the second gate insulating layer 152a, and the dummy gate insulating layer 153a may include and/or may be formed from, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate, etc.

The dummy gate structure 153 may be formed by the same process as the first and second gate structures 151 and 152.

The outer spacers 115 may be disposed on opposite sidewalls of each of the first gate structure 151, the second gate structure 152, and the dummy gate structure 153. The outer spacers 115 may include and/or may be formed from, for example, silicon nitride, silicon oxynitride, silicon oxide, silicon oxycarbonitride, etc., or a combination thereof. In some example embodiments, unlike the example embodiment shown in FIG. 2, the outer spacers 115 may be formed of multiple stacked layers and not a single layer.

For example, the first inner spacers 171 may be disposed between the dummy gate structure 153 and the outer spacers 115 and on portions of the corresponding sidewalls of the outer spacers 115. Thus, the upper surfaces of the first inner spacers 171, may be closer the substrate 101 than upper surfaces of the first and second gate structures 151 and 152.

According to some example embodiments, the upper surfaces of the first inner spacers 171 may contact the second portion 153_2p of the dummy gate structure 153. Additionally, the outer sidewalls of the first inner spacers 171 may contact the outer spacers 115 and inner spacers thereof may contact the first portion 153_1p of the dummy gate structure 153, sidewalk of the second inner spacer 172, and a device isolation layer 142. Lower surfaces of the first inner spacers 171 may contact the upper surfaces of the first to third fins F1, F2, and F3 and an upper surface of a capping layer 141.

The first inner spacers 171 may include and/or may be formed from, for example, silicon nitride, but is not limited thereto. In some example embodiments, the first inner spacers 171 may include and/or may be formed from, for example, silicon oxide, silicon carbide, silicon oxycarbide, silicon oxynitride, and/or silicon oxycarbonitride, etc.

A thickness t1 of the first inner spacers 171 (e.g., a thickness t1 of each of the first inner spacers 171 between the first portion 153_1p of the dummy gate structure 153 and each of the outer spacers 115) may be greater than a thickness t2 of the capping layer 141, but the example embodiments are not limited thereto and according to other example embodiments the thickness t2 may be equal to or greater than the thickness t1.

The second inner spacer 172 may be disposed between the dummy gate structure 153 and the device isolation layer 142, and the second inner spacer 172 may connect and/or be disposed between the first inner spacers 171 on opposite sidewalk of the first portion 153_1p of the dummy gate structure 153.

An upper surface of the second inner spacer 172 may contact the first portion 153_1p of the dummy gate structure 153. The opposite sidewalk of the second inner spacer 172 may contact the first inner spacers 171. A lower surface of the second inner spacer 172 may contact the device isolation layer 142.

The second inner spacer 172 may include and/or may be formed from, for example, silicon nitride, but is not limited thereto. In some example embodiments, the second inner spacer 172 may include and/or may be formed from, for example, silicon oxide, silicon carbide, silicon oxycarbide, silicon oxynitride, and/or silicon oxycarbonitride, etc., but is not limited thereto.

The device isolation region 140 may include the capping layer 141 and the device isolation layer 142, but is not limited thereto.

The capping layer 141 may conformally extend along an inner surface of the first recess 144, but the example embodiments of are not limited thereto.

The capping layer 141 may have a first surface contacting the first to third fins F1, F2, and F3, and a second surface opposite to the first surface. The device isolation layer 142 may be disposed on the second surface of the capping layer 141.

Since the thickness t1 of the first inner spacers 171 may be greater than the thickness t2 of the capping layer 141, a portion of each of the first inner spacers 171 may protrude further laterally than the second surface of the capping layer 141 (or protrude toward the first portion 153_1p of the dummy gate structure 153) according to some example embodiments. A portion of the lower surface of each of the first inner spacers 171 may contact an upper surface of the device isolation layer 142, but the example embodiments of are not limited thereto.

The capping layer 141 may include and/or may be formed from, for example, silicon nitride, etc. In some example embodiments, the capping layer 141 may include and/or may be formed from, for example, silicon oxide, silicon carbide, silicon oxycarbide, silicon oxynitride, and/or silicon oxycarbonitride, etc.

The capping layer 141 may include the same material as the first inner spacers 171 and the second inner spacer 172. For example, when the first inner spacers 171 and the second inner spacer 172 include silicon nitride, the capping layer 141 may also include silicon nitride. However, the example embodiments are not limited thereto.

The device isolation layer 142 may be disposed on the capping layer 141 and may fill the first recess 144. The upper surface of the device isolation layer 142 may be higher than the upper surfaces of the first to third fins F1, 12, and F3 with respect to the upper surface of the substrate 101, but the example embodiments are not limited thereto.

The device isolation layer 142 may extend in the second direction Y1. The device isolation layer 142 may be formed on the field insulating layer 110 and in (e.g., disposed on) the first to third fins F1, F2, and F3. A lower surface of the device isolation layer 142 may be lower than lower surfaces of the source/drain regions 123 with respect to the upper surface of the substrate 101.

The device isolation layer 142 may separate the source/drain regions 123 disposed at opposite sides of the device isolation layer 142 to reduce and/or prevent a short circuit between the source/drain regions 123 and current flows.

A width W3 of the device isolation layer 142 (e.g., width of an upper portion of the device isolation layer 142) may be greater than the width W1 of the first portion 153_1p of the dummy gate structure 153, but the example embodiments are not limited thereto. In some example embodiments, the width W3 of the device isolation layer 142 may be substantially equal to the width W1 of the first portion 153_1p of the dummy gate structure 153.

The device isolation layer 142 may include and/or may be formed from, for example, silicon oxide, etc. In some example embodiments, the device isolation layer 142 may include and/or may be formed from, for example, silicon nitride, silicon carbide, silicon oxycarbide, silicon oxynitride, and/or silicon oxycarbonitride, etc.

Referring to FIG. 3B, a dielectric layer 170 may include the first inner spacers 171, the second inner spacer 172, and the capping layer 141. For example, the dielectric layer 170 may include the first inner spacers 171 (e.g., a pair of first parts of the dielectric layer 170) on the portions of the sidewalls of the outer spacers 115, the second inner spacer 172 (e.g., a second part of the dielectric layer 170) disposed between the dummy gate insulating layer 153a and the device isolation layer 142 and connecting the first inner spacers 171, and the capping layer 141 (e.g., a third part of the dielectric layer 170) disposed between the inner surface of the first recess 144 and the device isolation layer 142.

The dielectric layer 170 and the device isolation layer 142 may include and/or maybe formed from different materials. For example, the dielectric layer 170 may include and/or may be formed from, silicon nitride, etc., and the device isolation layer 142 may include and/or may be formed from silicon oxide, etc.

The source/drain regions 123 may be disposed at opposite sides of each of the first gate structure 151, the second gate structure 152 and the dummy gate structure 153. For example, the source/drain regions 123 may be disposed between the first gate structure 151 and the dummy gate structure 153 and between the second gate structure 152 and the dummy gate structure 153, respectively. The source/drain regions 123 may be disposed in the first to third fins F1, F2, and F3. The source/drain regions 123 may be formed by partially etching the first to third fins F1, F2, and F3 and growing epitaxial layers on the etched portions, respectively, of the first to third fins F1, F2, and F3 according to some example embodiments.

The plurality of source/drain regions 123 may each be an elevated source/drain region. An upper surface of each of the source/drain regions 123 may be higher than the upper surfaces of the first to third fins F1, F2, and F3, with respect to the upper surface of the substrate 101 according to at least one example embodiment, but the example embodiments are not limited thereto.

According to at least one example embodiment, when the semiconductor device is a PMOS transistor, the source/drain regions 123 may include a compressive stress material. For example, the compressive stress material may include a material having a lattice constant greater than Si, for example, SiGe, etc. The compressive stress material may impart compressive stress to portions of the one or more fins, e.g., first to third fins F1, F2, and F3, below the one or more gate structures, e.g., first and second gate structures 151 and 152 (or channel regions of the transistors), to increase the carrier mobility in the channel regions.

When the semiconductor device is an NMOS transistor, the source/drain regions 123 may include and/or may be formed from a tensile stress material or the same material as the substrate 101. For example, when the substrate 101 is a silicon substrate, the source/drain regions 123 may include and/or may be formed from Si. In some example embodiments, the source/drain regions 123 may include and/or may be formed from a material having a lattice constant smaller than Si, for example, SiC or SiP, etc.

The silicide layer 161 may be disposed on each of the source/drain regions 123. The silicide layer 161 may be formed along an upper surface of each of the source/drain regions 123. The silicide layer 161 may reduce contact resistance and/or sheet resistance when the silicide layer 161 and each of the source/drain regions 123 contact each other. The silicide layer 161 may include and/or may be formed from a conductive material, for example, Pt, Ni, Co, or the like.

The silicide layer 161 may be formed on all of the source/drain regions 123 as shown in FIG. 2, but the example embodiments are not limited thereto. For example, the silicide layer 161 may be formed on some of the source/drain regions 123.

In some example embodiments, the silicide layer 161 may be omitted. For example, the semiconductor device may not include a silicide layer.

The contact 163 may be disposed on the silicide layer 161. The contact 163 may include and/or may be formed from a conductive material, for example, W, Al, and/or Cu, etc., but the example embodiments are not limited thereto.

The first interlayer insulating layer 131 and the second interlayer insulating layer 132 may be sequentially stacked on the field insulating layer 110 and/or the one or more fins, e.g., the first to third fins F1, F2, and F3. The first interlayer insulating layer 131 may cover the sidewalls of the outer spacers 115 and a portion of a sidewall of the contact 163 according to some example embodiments. The second interlayer insulating layer 132 may cover the other portion of the sidewall of the contact 163.

An upper surface of the first interlayer insulating layer 131 may be coplanar with an upper surface of each of the first gate structure 151, the second gate structure 152, and the dummy gate structure 153. By a planarization process (e.g., a chemical mechanical polishing (CMP) process), the upper surface of the first interlayer insulating layer 131 may be positioned at the same and/or substantially similar level as the upper surface of each of the gate structures of the semiconductor device, such as the first gate structure 151, the second gate structure 152, and the dummy gate structure 153, with respect to the upper surface of the substrate 101. In some example embodiments, the upper surface of the first interlayer insulating layer 131 may be positioned at a different level from the upper surface of each of the first gate structure 151, the second gate structure 152, and the dummy gate structure 153, with respect to the upper surface of the substrate 101.

The second interlayer insulating layer 132 may cover each of the first gate structure 151, the second gate structure 152 and the dummy gate structure 153. The first interlayer insulating layer 131 and the second interlayer insulating layer 132 may include and/or may be formed from, e.g., silicon, nitride, and/or silicon oxynitirde, etc.

FIGS. 4 to 20 are cross-sectional views illustrating a method of manufacturing a semiconductor device according to some example embodiments. FIGS. 4 to 20 correspond to cross-sectional views taken along line A-A' of FIG. 1. In FIGS. 4 to 20, a method of manufacturing the semiconductor device on the second fin F2 shown in FIG. 2 according to some example embodiments will be mainly described, but the example embodiments are not limited thereto.

Figure 4:
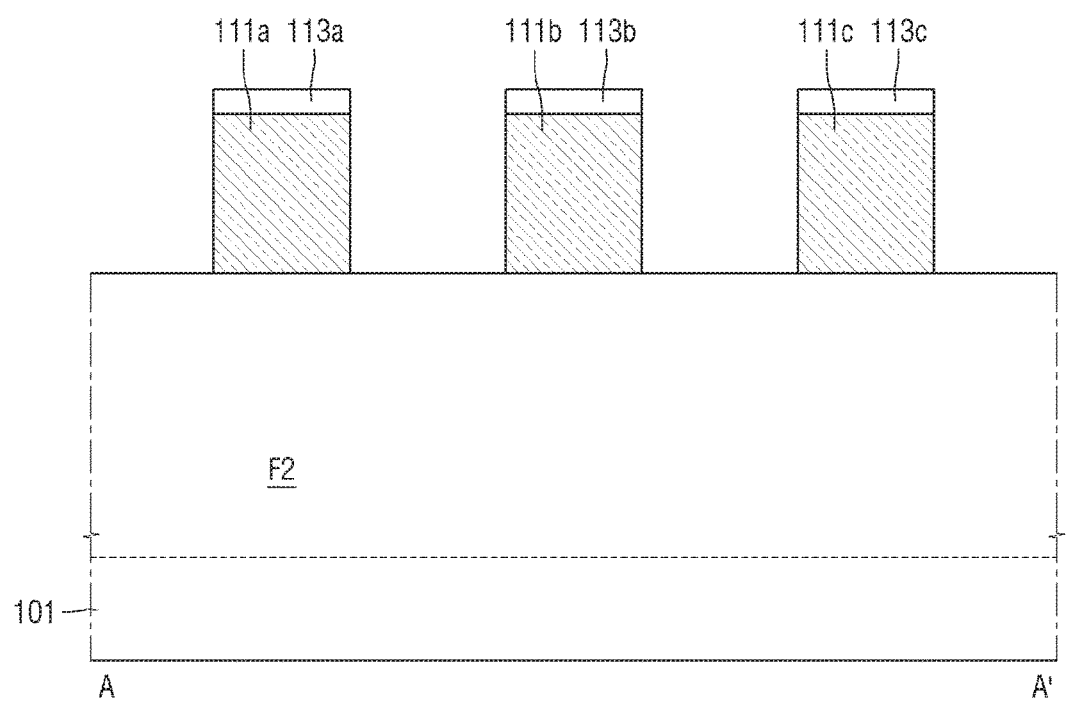
FIGS. 4 to 20 are cross-sectional views illustrating a method of manufacturing a semiconductor device according to some example embodiments.
Figure 4:
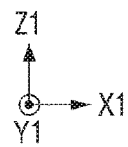

Referring to FIG. 4, the second fin F2 may be formed on the substrate 101. The second fin F2 may be formed on the substrate 101 and may protrude in the third direction Z1.

The second fin F2 may extend in a first direction X1 that is a length direction of the second fin F2 and may have a long side in the first direction X1 and a short side in the second direction Y1. The second fin F2 may be a portion of the substrate 101 and may include an epitaxial layer grown from the substrate 101. The second fin F2 may include and/or may be formed from Si and/or SiGe, etc.

An insulating layer may be formed to cover a sidewall of the second fin F2. The insulating layer may include and/or may be formed from, for example, silicon oxide, silicon nitride, and/or silicon oxynitride, etc.

An upper portion of the insulating layer may be removed (e.g., etched away) to form the field insulating layer 110 and expose an upper portion of the second fin F2. The removing process may include a selective etching process.

A portion of the second fin F2 protruding above the field insulating layer 10 may be formed by an epitaxial growing process. For example, after forming the insulating layer, the protruding portion of the second fin F2 may be formed by an epitaxial growing process using an upper surface of the second fin 2 may be exposed by the insulating layer as a seed, without performing the removing process.

Further, a doping process for adjusting a threshold voltage may be performed on the exposed second fin F2. For example, when forming the NMOS transistor, boron (B) may be used as a dopant in the doping process for adjusting the threshold voltage of the transistor. When forming the PMOS transistor, phosphorus (P) or arsenic (As), etc., may be used as dopants in the doping process for adjusting the threshold voltage of the transistor.

First, second, and third sacrificial gate structures 111*a*, 111*b*, and 111*c*, may be formed on the second fin F2 and may intersect (e.g., cross) the second fin F2. The first to third sacrificial gate structures 111*a*, 111*b*, and 111*c* may be spaced apart in the first direction X1.

The first to third sacrificial gate structures 111*a*, 111*b*, and 111*c* may intersect (e.g., cross) the second fin F2 at a tight angle to the first direction X1. In some example embodiments, the first to third sacrificial gate structures 111*a*, 111*b*, and 111*c* may intersect (e.g., cross) the second fin F2 while forming an acute angle or an obtuse angle with the first direction X1.

The first to third sacrificial gate structures 111*a*, 111*b*, and 111*c* may be formed on the upper surface and an upper portion of the sidewall of the second fin F2. The first to third sacrificial gate structures 111*a*, 111*b*, and 111*c* may include and/or may be formed from, for example, polysilicon or amorphous silicon, etc.

First, second, and third hard mask layers 113*a*, 113*b*, and 113*c* may be formed on the first to third sacrificial gate structures 111*a*, 111*b*, and 111*c*, respectively. The first to third hard mask layers 113*a*, 113*b*, and 113*c* may include and/or may be formed from, for example, silicon oxide, silicon nitride, and/or silicon oxynitirde, etc.

Figure 5:
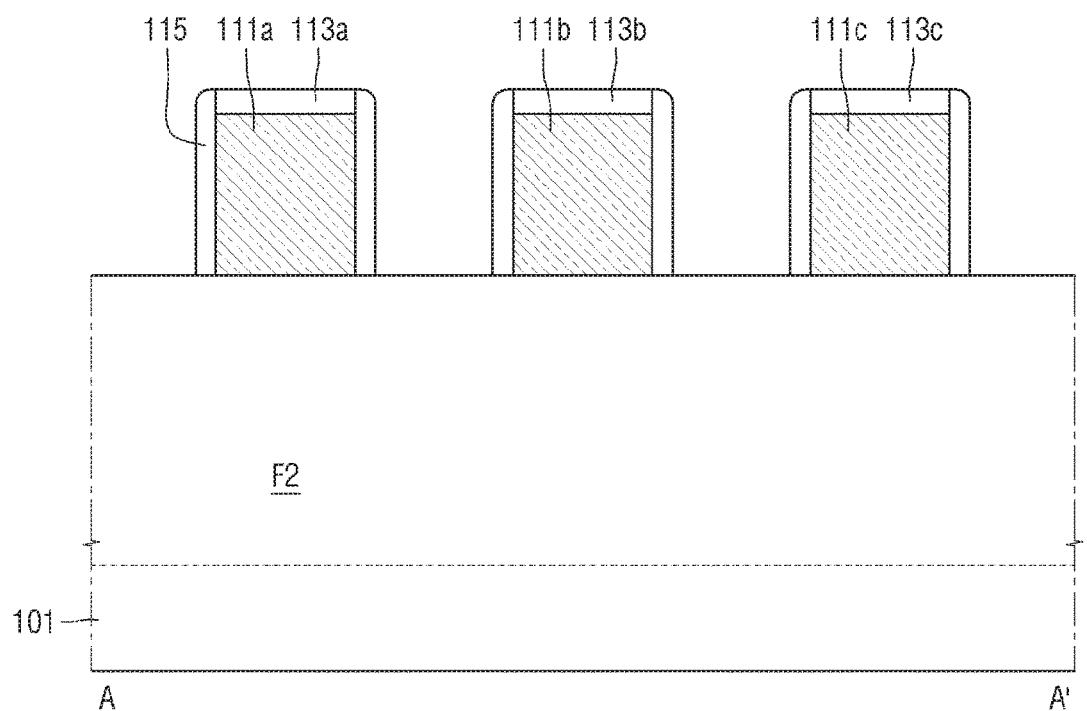

Referring to FIG. 5, the plurality of outer spacers 115 may be formed on opposite sidewalls of each of the one or more sacrificial gate structures, e.g., the first to third sacrificial gate structures 111*a*, 111*b*, and 111*c*. The plurality of outer spacers 115 may expose upper surfaces of the plurality of hard mask layers, e.g., the first to third hard mask layers 113*a*, 113*b*, and 113*c*. The outer spacers 115 may include and/or may be formed from, for example, silicon nitride, silicon oxynitride, and/or silicon oxycarbonitride, etc.

Figure 6:
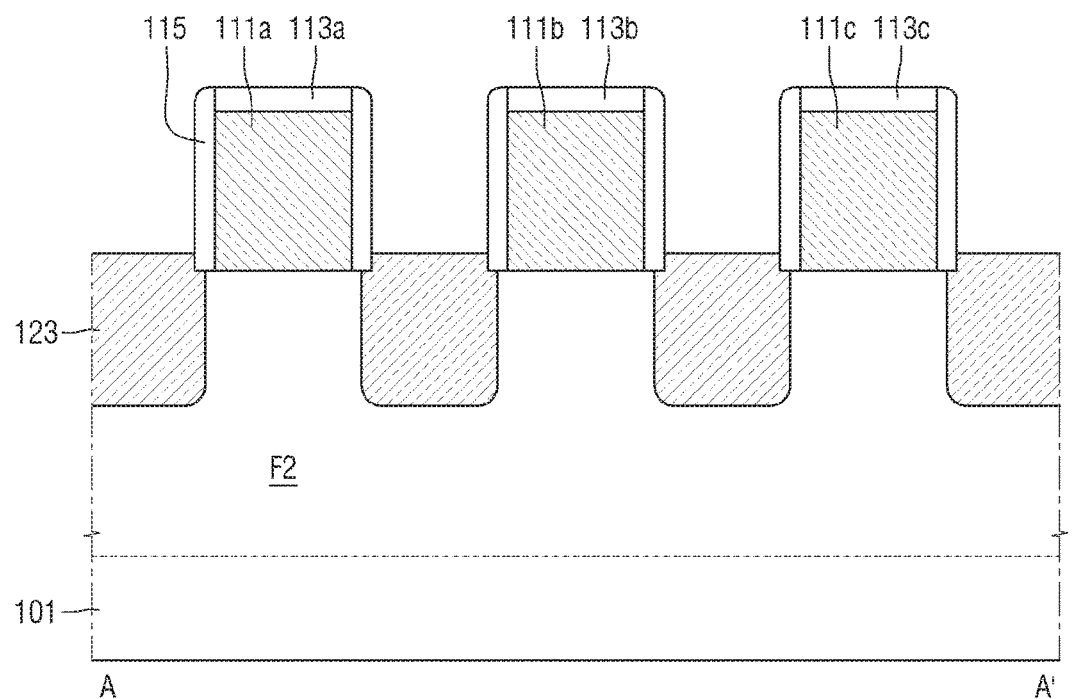

Referring to FIG. 6, the second fin F2 may be etched. The second fin F2 may be partially etched except for portions covered by the first to third sacrificial gate structures 111*a*, 111*b*, and 111*c*. For example, portions of the second fin F2 exposed between the first to third sacrificial gate structures 111*a*, 111*b*, and 111*c* may be etched. The second fin F2 may be etched using the outer spacers 115 and the first to third hard mask layers 113*a*, 113*b*, and 113*c* as an etch mask.

The source/drain regions 123 may be formed in the exposed portions of the second fin F2. The source/drain regions 123 may be elevated source/drain regions according to some example embodiments, but are not limited thereto. Upper surfaces of the source/drain regions 123 may be higher than the upper surface of the second fin F2 with respect to an upper surface of the substrate 101. The source/drain regions 123 may be formed by an epitaxial growing process.

Figure 7:
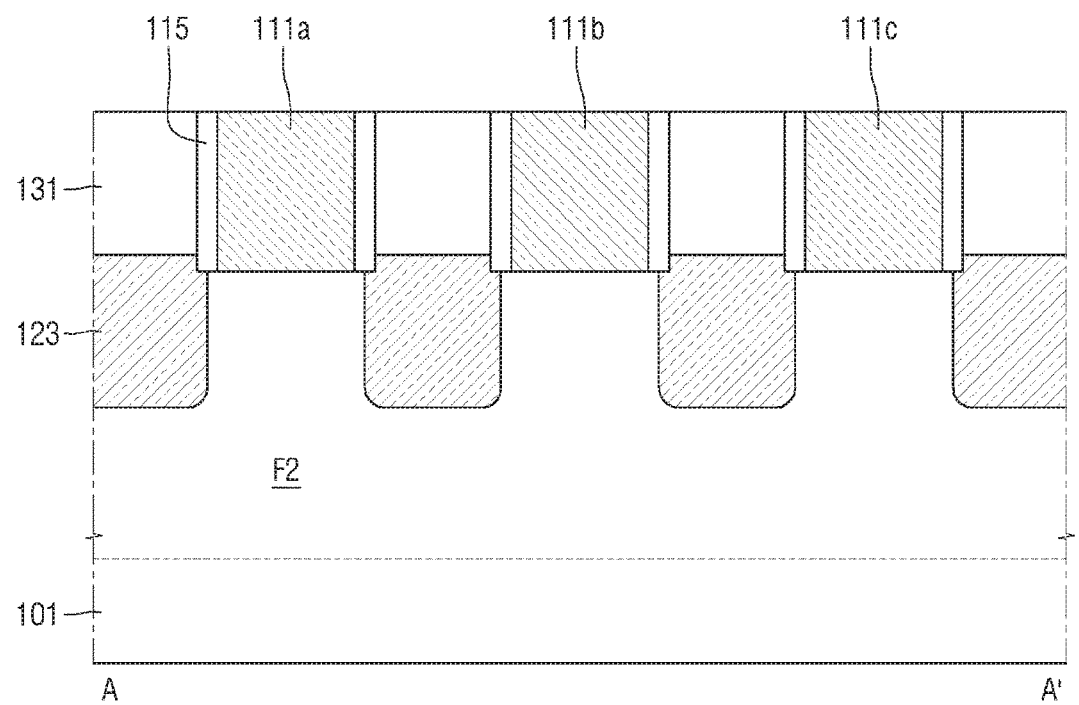

Referring to FIG. 7, the first interlayer insulating layer 131 may be formed to cover the source/drain regions 123. The first interlayer insulating layer 131 may cover sidewalls of the outer spacers 115 and may expose the upper surfaces of the first to third hard mask layers 113a, 113b, and 113c. The first interlayer insulating layer 131 may include and/or may be formed from, for example, an oxide layer. The first to third hard mask layers 113a, 113b, and 113c may then be removed.

Figure 8:
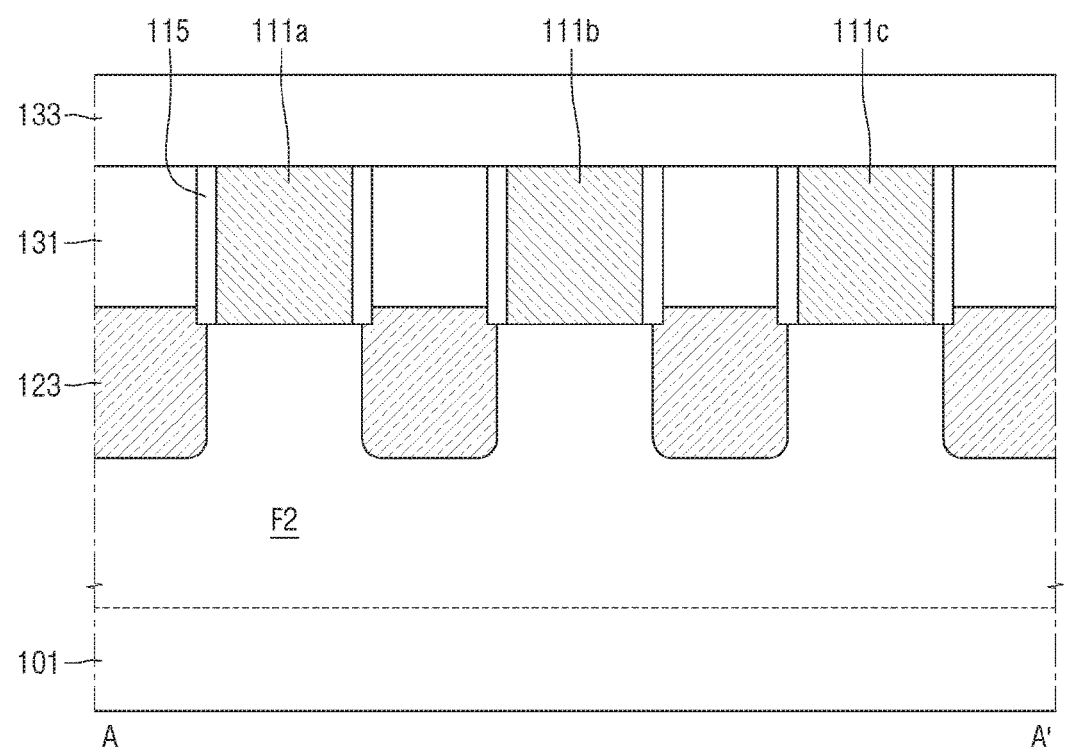

Referring to FIG. 8, a protection layer 133 may be formed to cover the upper surfaces of the first interlayer insulating layer 131 and the sacrificial gate structures, e.g., the first to third sacrificial gate structures 111a, 111b, and 111c. The protection layer 133 may reduce and/or prevent the first interlayer insulating layer 131 from being etched in a subsequent process. The protection layer 133 may include and/or may be formed from, for example, a nitride layer or an oxynitride layer, etc.

Figure 9:
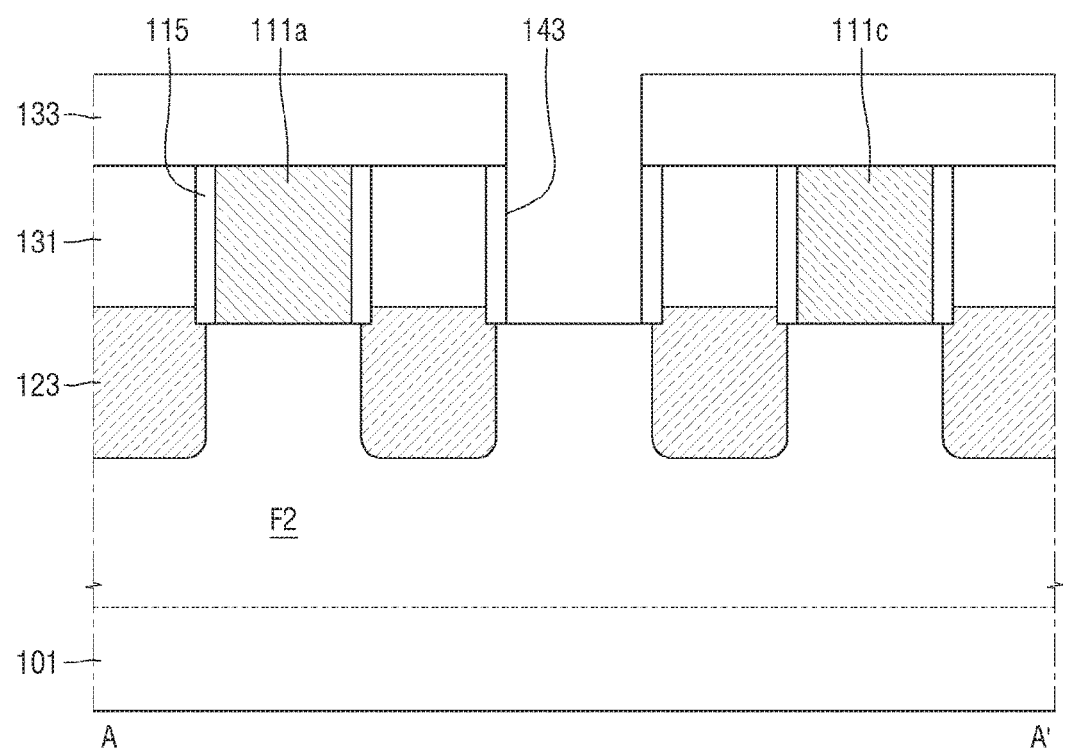

Referring to FIG. 9, an etch mask pattern may be formed on the protection layer 133, and an etch process may be performed using the etch mask pattern to form a second recess 143 (e.g., a second recess region). To form the second recess 143, the protection layer 133 on the second sacrificial gate structure 111b and the second sacrificial gate structure 111b may be sequentially etched. The second recess 143 may expose a portion of the second fin F2. The etch mask pattern may then be removed.

Figure 10:
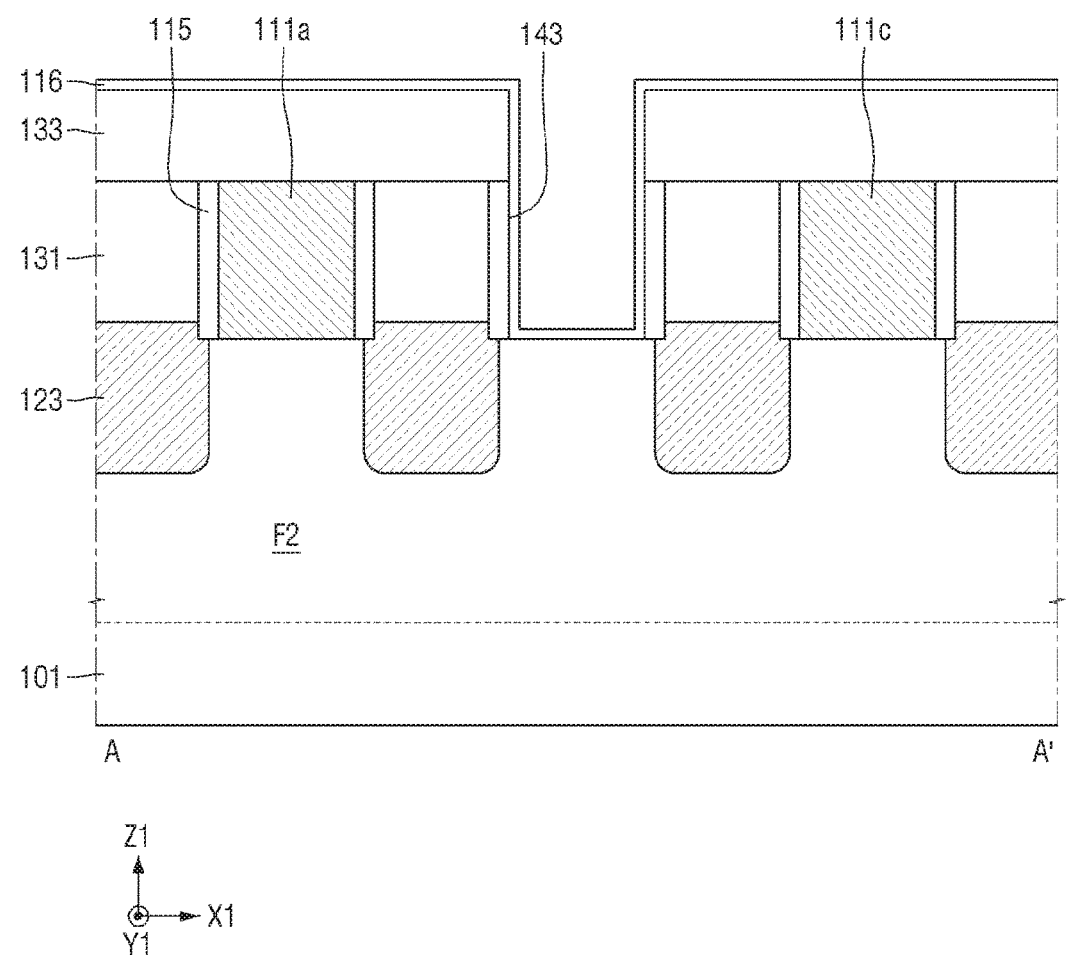

Referring to FIG. 10, a first insulating layer 116 may be conformally formed on a sidewall of the second recess 143, the portion of the second fin F2 exposed by the second recess 143, and the protection layer 133. A portion of the first insulating layer 116 may form a portion of each of the first inner spacers 171 through the following process according to at least one example embodiment, but the example embodiments are not limited thereto.

The first insulating layer 116 may include and/or may be formed from, for example, silicon nitride, etc., but the example embodiments are not limited thereto.

Figure 11:
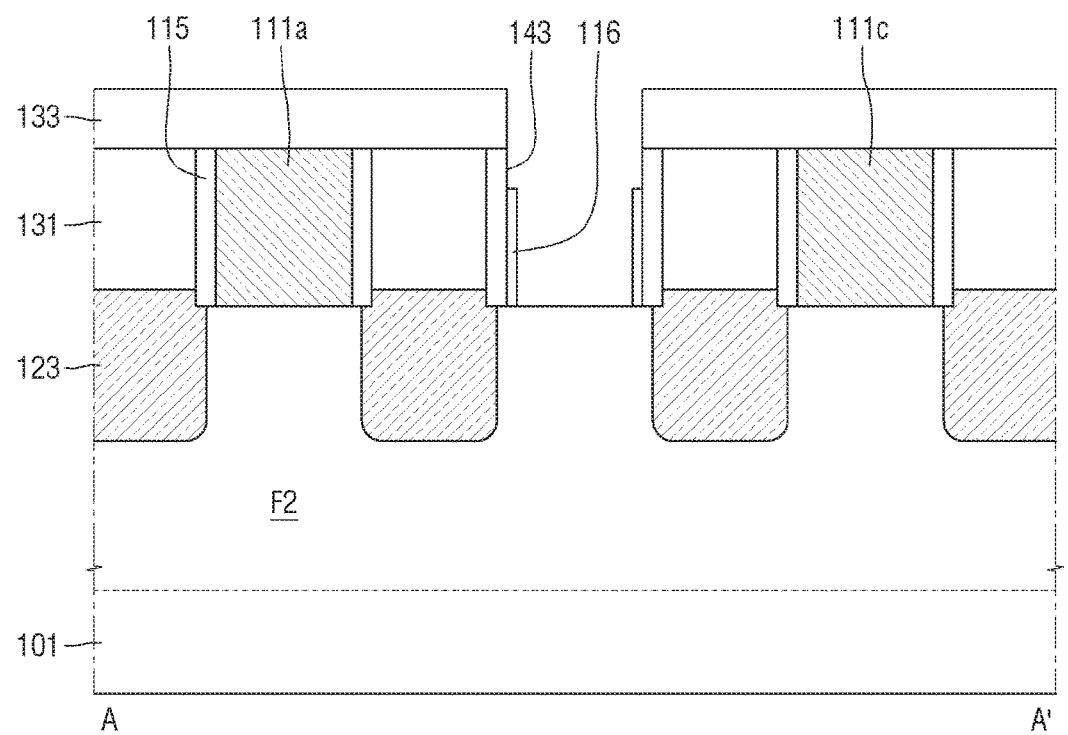

Referring to FIG. 11, a portion of the first insulating layer 116 and a portion of the protection layer 133 may be etched through an etch-back process. For example, the first insulating layer 116 on the protection layer 133, an upper portion of the protection layer 133, and a portion of the first insulating layer 116 on an upper sidewall of the second recess 143 may be etched through the etch-back process, but the example embodiments are not limited thereto. Thus, the first insulating layer 116 may remain on a portion of the sidewall of the second recess 143.

Figure 12:
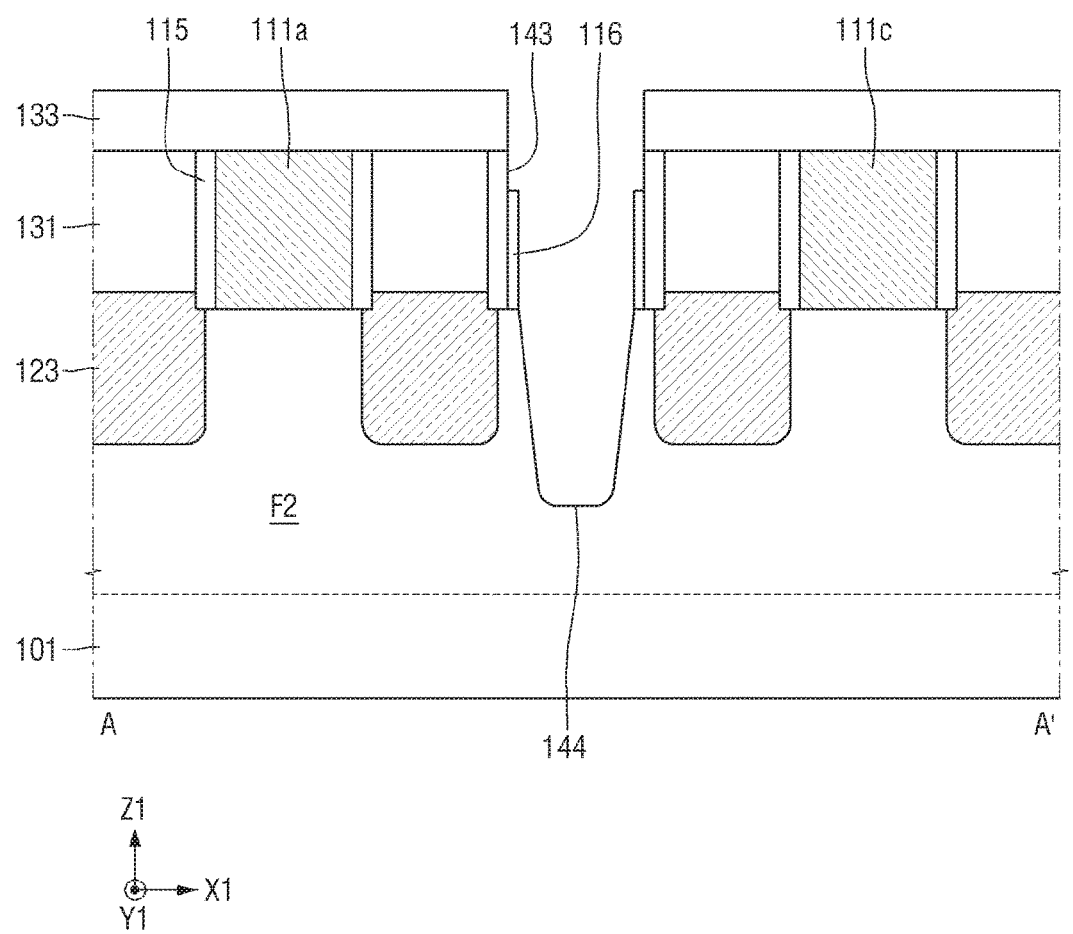

Referring to FIG. 12, the second fin F2 may be etched to form the first recess 144 below the second recess 143. The first recess 144 may be formed using the protection layer 133 and the first insulating layer 116 as an etch mask according to at least one example embodiment. A sidewall of the first recess 144 may be aligned to an outer sidewall of the first insulating layer 116.

Figure 13:
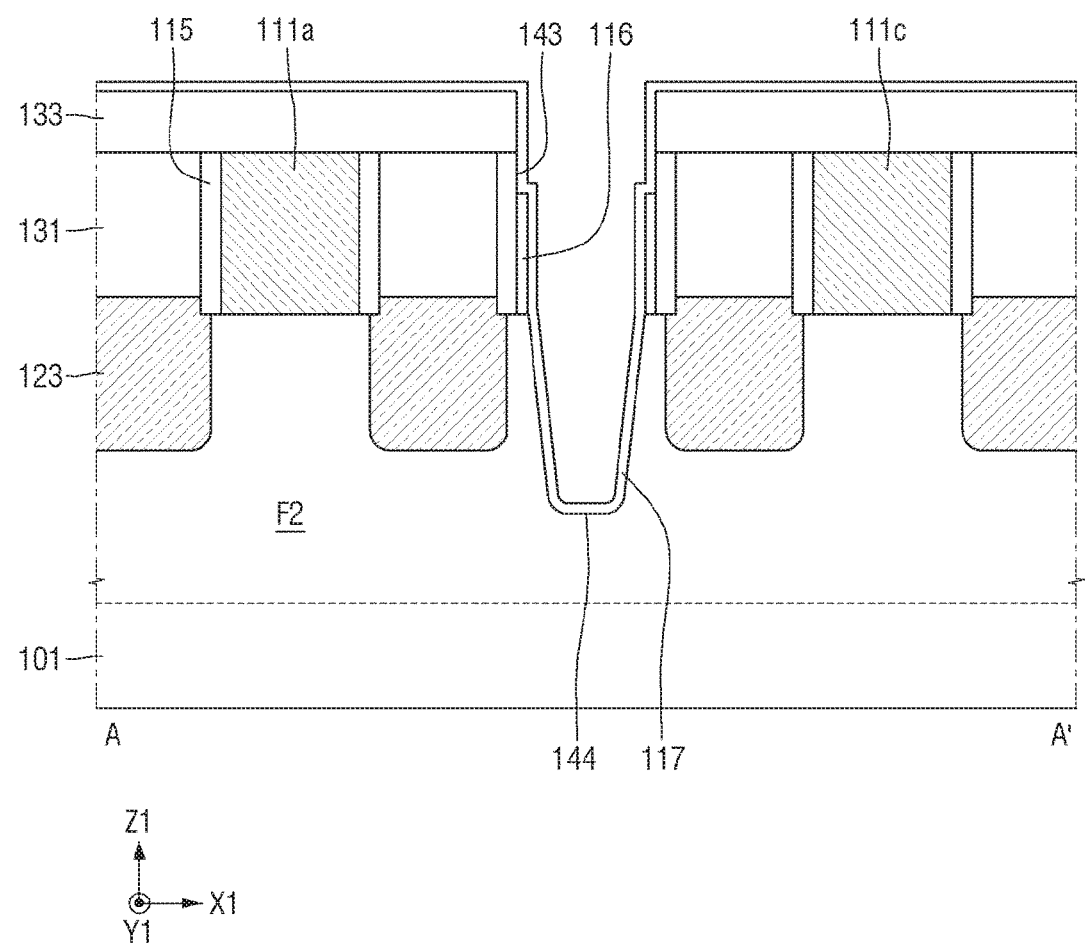

Referring to FIG. 13, a second insulating layer 117 may be conformally formed on an upper surface of the protection layer 133, the sidewall of the second recess 143, an upper surface and the outer sidewall of the first insulating layer 116, and an inner surface of the first recess 144. A portion of the second insulating layer 117 may form the capping layer 141 and a portion of each of the plurality of first inner spacers 171 through the following process.

The second insulating layer 117 may include and/or may be formed from, for example, silicon nitride, etc., but the example embodiments are not limited thereto.

Figure 14:
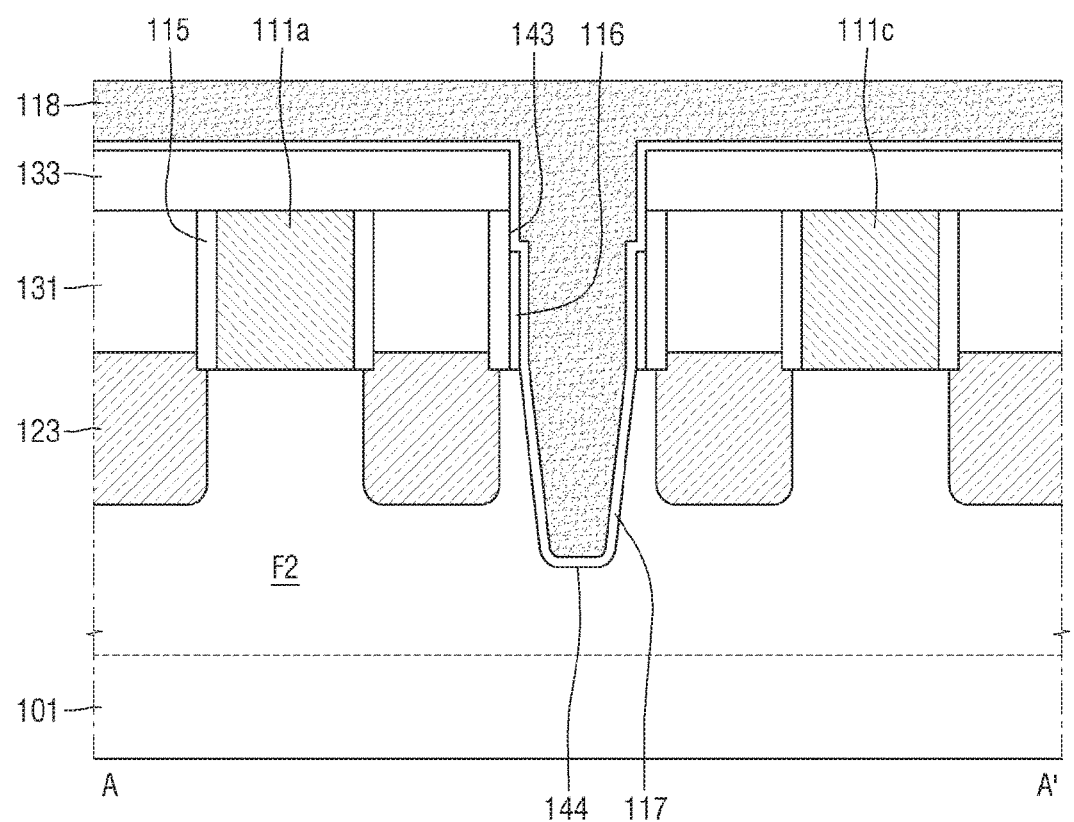

Referring to FIG. 14, a third insulating layer 118 may be formed on the second insulating layer 117. For example, the third insulating layer 118 may be formed to cover the second insulating layer 117 on the protection layer 133 and fill the first and second recesses 144 and 143. The third insulating layer 118 may include and/or may be formed from, for example, silicon oxide, etc., but the example embodiments are not limited thereto.

Figure 15:
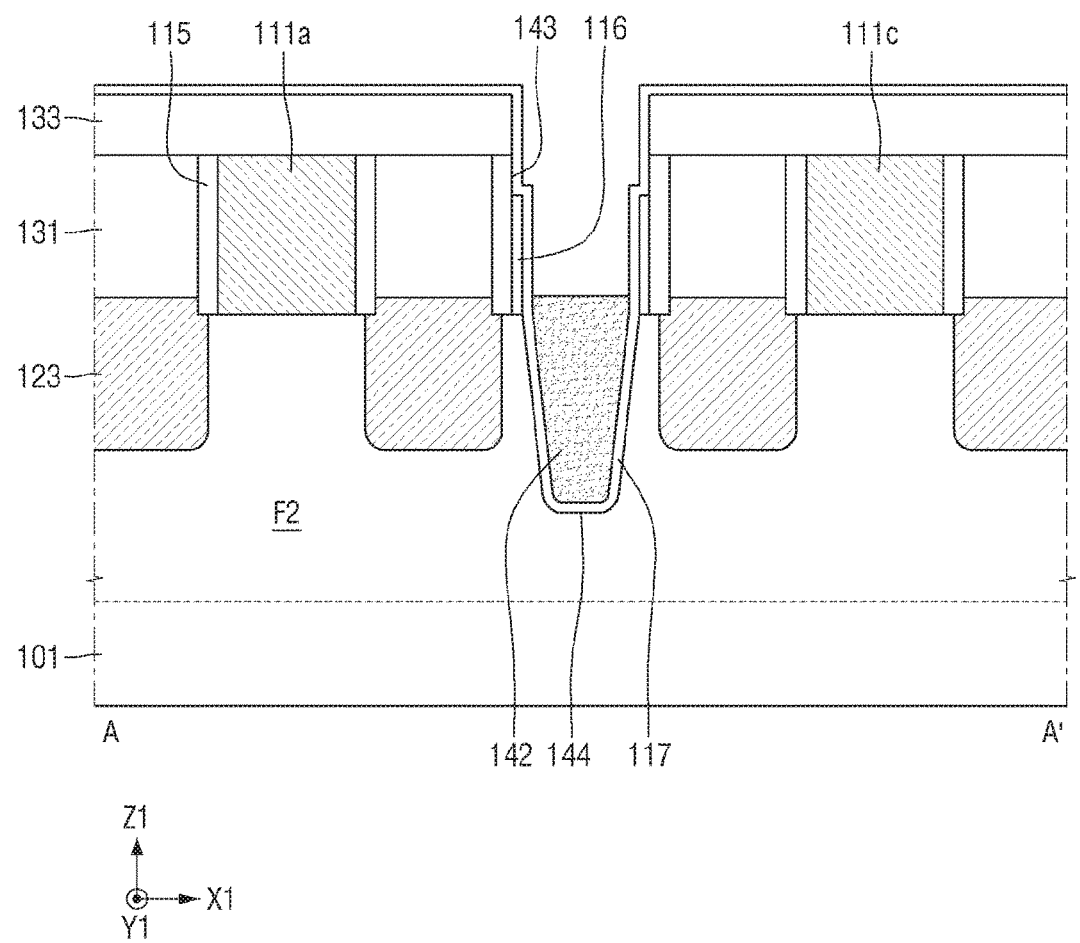

Referring to FIG. 15, a portion of the third insulating layer 118 disposed on the protection layer 133 and in the second recess 143 may be etched to form the device isolation layer 142 in at least the first recess 144 and expose a portion of the second insulating layer 117. An upper surface of the device isolation layer 142 may be higher than the upper surface of the second fin F2 with respect to the upper surface of the substrate 101. However, the example embodiments are not limited thereto.

Figure 16:
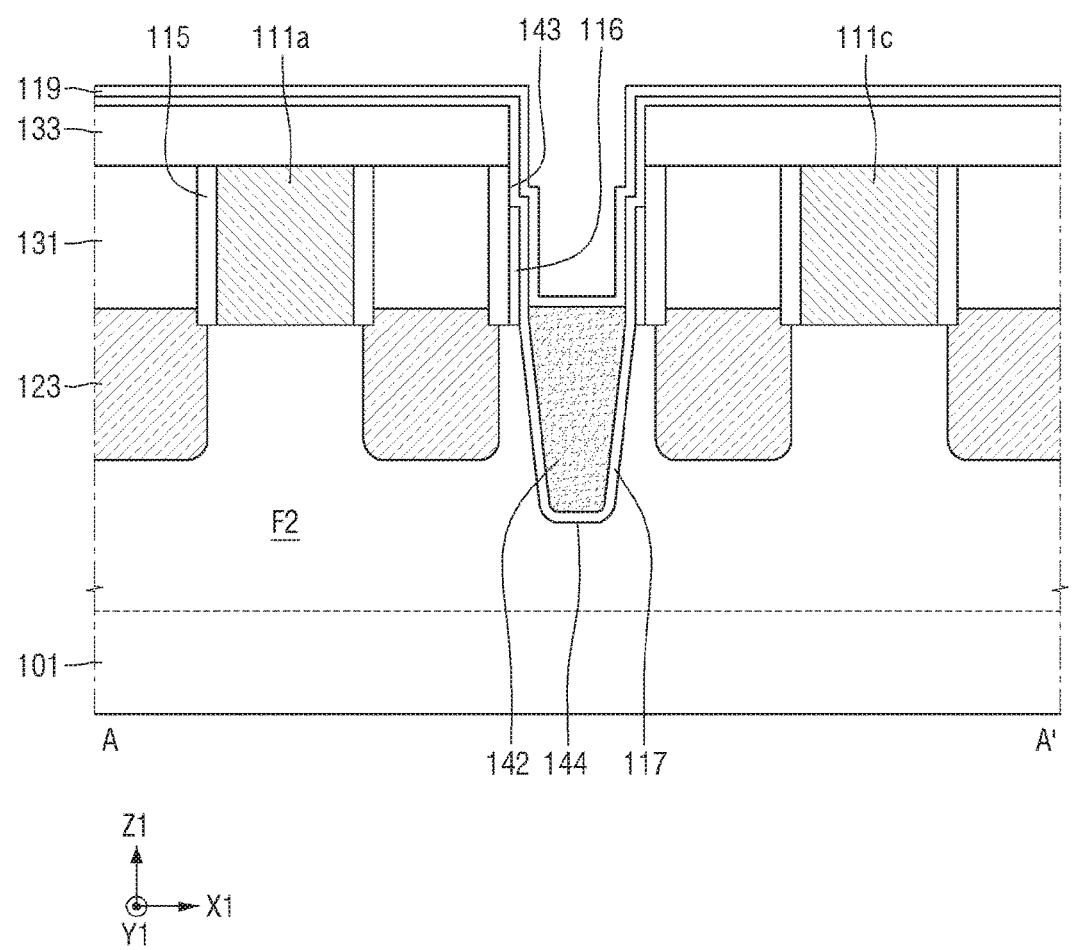

Referring to FIG. 16, a fourth insulating layer 119 may be conformally formed on the exposed second insulating layer 117 and the device isolation layer 142. A portion of the fourth insulating layer 119 may form a portion of each of the plurality of first inner spacers 171 and the second inner spacer 172 through the following process.

The fourth insulating layer 119 may include and/or may be formed from, for example, silicon nitride, etc., but the example embodiments are not limited thereto.

Figure 17:
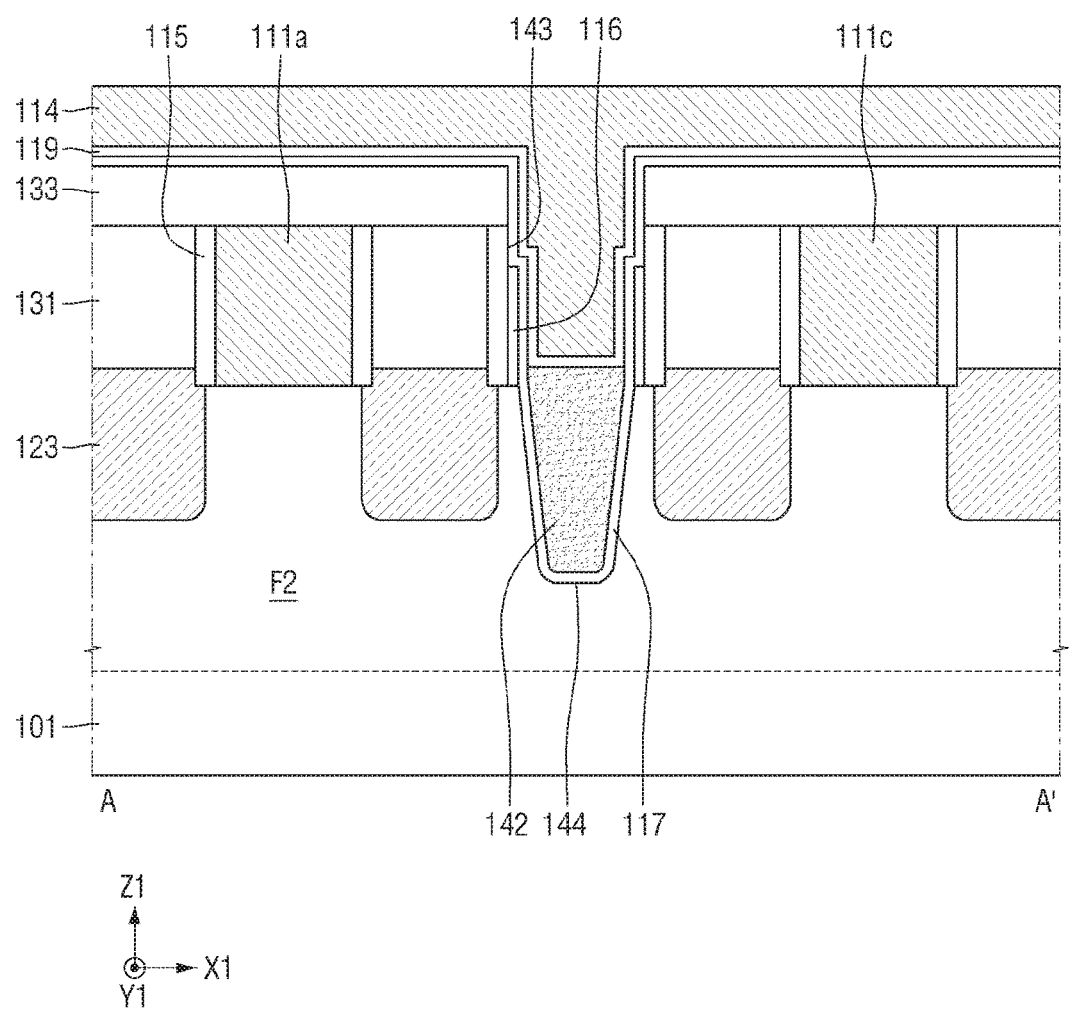
Figure 18:
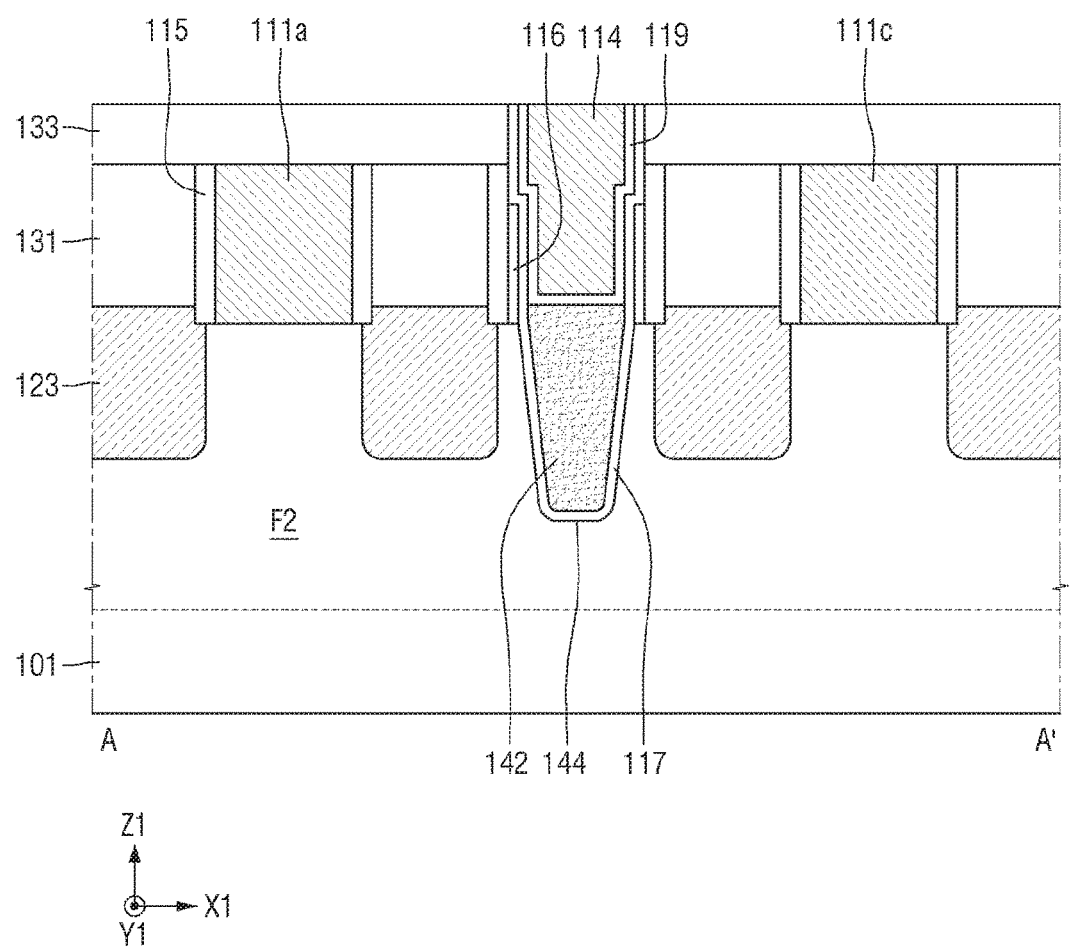

Referring to FIG. 17, at least one sacrificial gate layer 114 may be formed on the fourth insulating layer 119. The sacrificial gate layer 114 may be formed to cover the fourth insulating layer 119 on the protection layer 133 and fill the second recess 143. The sacrificial gate layer 114 may include and/or may be formed from, for example, polysilicon or amorphous silicon, etc.

Referring to 18, a planarization process (e.g., a CMP process, etc.) may be performed on the resulting structure of FIG. 17. Thus, the upper surface of the protection layer 133, an upper surface of the second insulating layer 117, an upper surface of the fourth insulating layer 119, and an upper surface of the sacrificial gate layer 114, may be coplanar and/or substantially coplanar with respect to one another.

Figure 19:
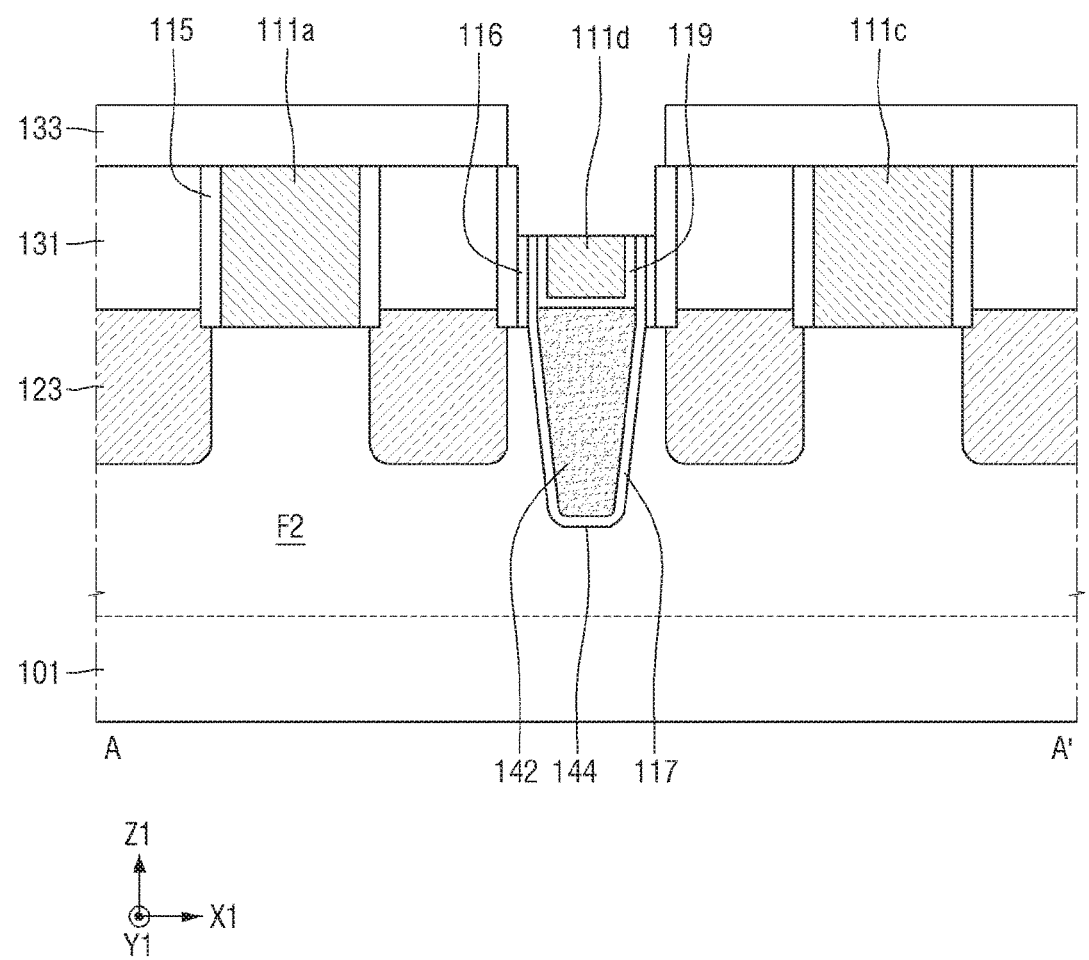

Referring to FIG. 19, according to at least one example embodiment, an etch mask pattern may be formed on the protection layer 133, and an etch process may be performed using the etch mask pattern to etch a portion of each of the first, second and fourth insulating layers 116, 117, and 119 and the sacrificial gate layer 114. Thus, a fourth sacrificial gate structure 111d may be formed in a space defined by the fourth insulating layer 119. The etch mask pattern may then be removed.

Figure 20:
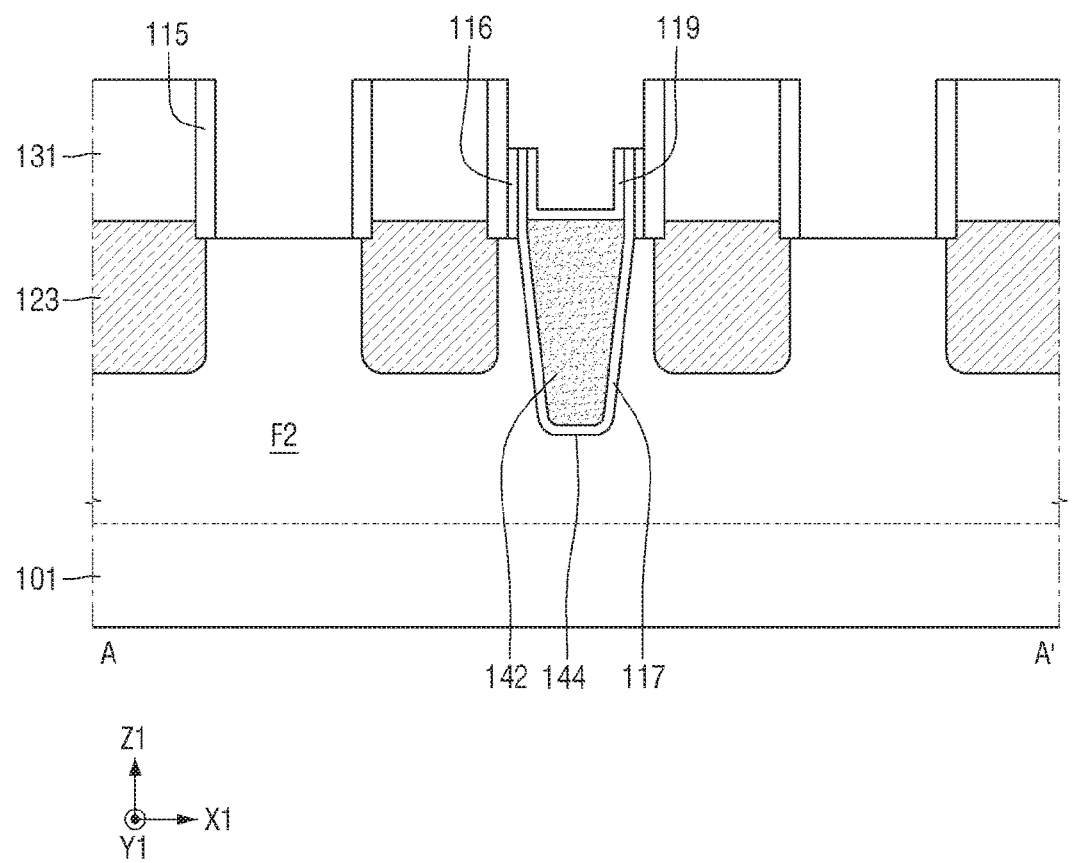

Referring to FIGS. 2 and 20, after removing the protection layer 133, the first, second, and fourth sacrificial gate structures 111a, 111b, and 111d may be removed.

The first gate structure 151 may be formed where the first sacrificial gate structure 111a is removed. The second gate structure 152 may be formed where the second sacrificial gate structure 111b is removed. The dummy gate structure 153 may be formed where the fourth sacrificial gate structure 111d is removed.

The first gate structure 151, the second gate structure 152, and the dummy gate structure 153 may be formed simultaneously according to at least one example embodiment, but the example embodiments are not limited thereto.

The second interlayer insulating layer 132 may be formed on the first gate structure 151, the second gate structure 152, the dummy gate structure 153, and the first interlayer insulating layer 131. The contact 163 may be formed to penetrate the first and second interlayer insulating layers 131 and 132 according to at least one example embodiment.

Figure 21:
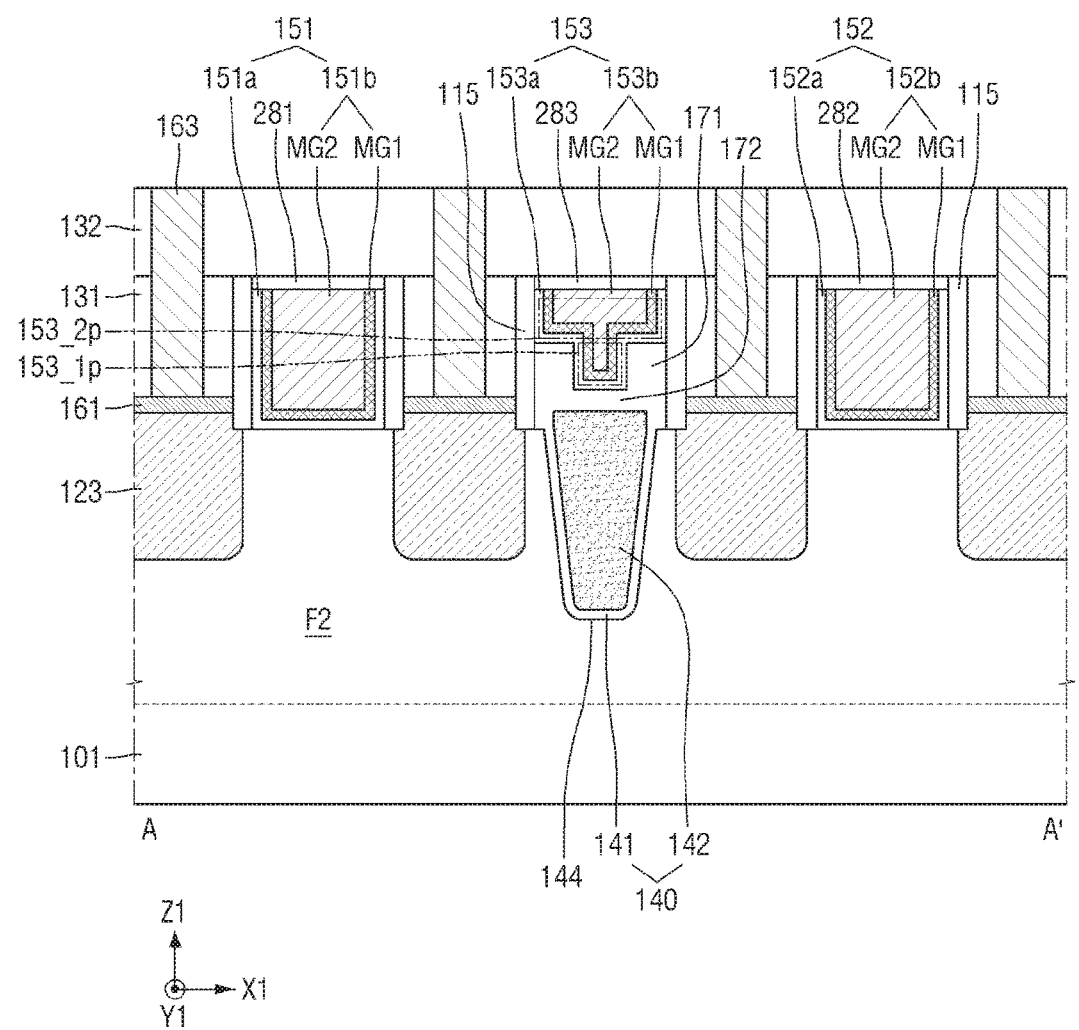
FIG. 21 is a cross-sectional view illustrating a semiconductor device according to some example embodiments.

FIG. 21 is a cross-sectional view illustrating a semiconductor device according to at least one example embodiment and taken along line A-A' of FIG. 1.

Referring to FIG. 21, a semiconductor device may further include a plurality of capping patterns, such as the first, second, and third capping patterns 281, 282, and 283, unlike the semiconductor device shown in FIG. 2. For example, the semiconductor device shown in FIG. 21 may further include the first capping pattern 281 on the first gate structure 151, the second capping pattern 282 on the second gate structure 152, and the third capping pattern 283 on the dummy gate structure 153, as compared to the semiconductor device shown in FIG. 2.

The first to third capping patterns 281, 282, and 283 may include and/or may be formed from, for example, silicon nitride, silicon oxynitride, silicon carbonitride, silicon oxycarbonitride, and/or silicon oxycarbide, etc.

Figure 22:
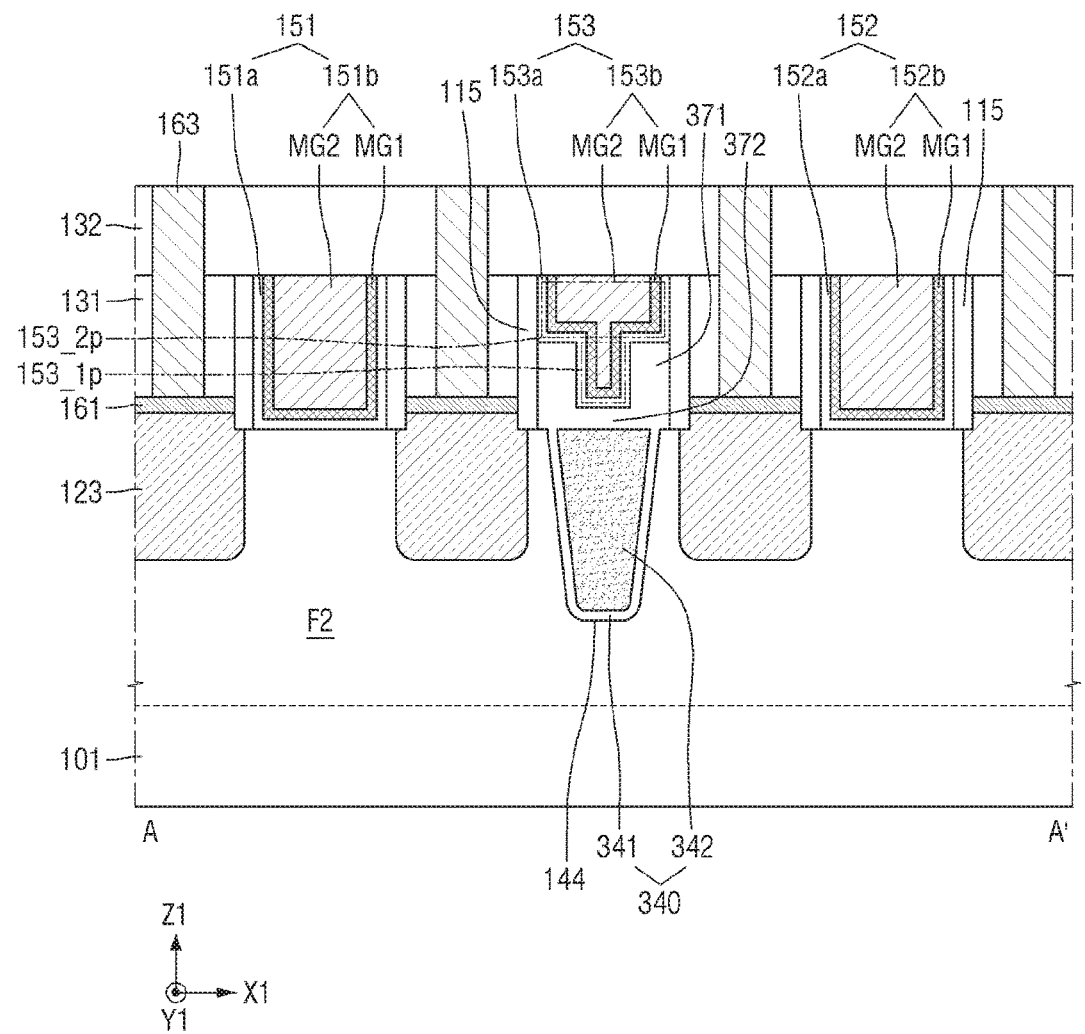
FIG. 22 is a cross-sectional view illustrating a semiconductor device according to some example embodiments.

FIG. 22 is a cross-sectional view illustrating a semiconductor device according to at least one example embodiment and taken along line A-A' of FIG. 1. Hereinafter, the contents identical to those of the previously described figures will be omitted, and different components or elements will be mainly described.

Referring to FIG. 22, a semiconductor device may include a device isolation region 340 having an upper surface coplanar and/or substantially coplanar with the upper surfaces of the plurality of fins, e.g., the first to third fins F1, F2, and F3, unlike the semiconductor device shown in FIG. 2.

In the semiconductor device shown in FIG. 22, an upper surface of a capping layer 341, an upper surface of a device isolation layer 342, and upper surfaces of the first to third fins F1, F2, and F3 may be coplanar and/or substantially coplanar with one another, compared to the semiconductor device shown in FIG. 2. Further, lower surfaces of first inner spacers 371 and a lower surface of a second inner spacer 372 may be coplanar and/or substantially coplanar with each other.

Figure 23:
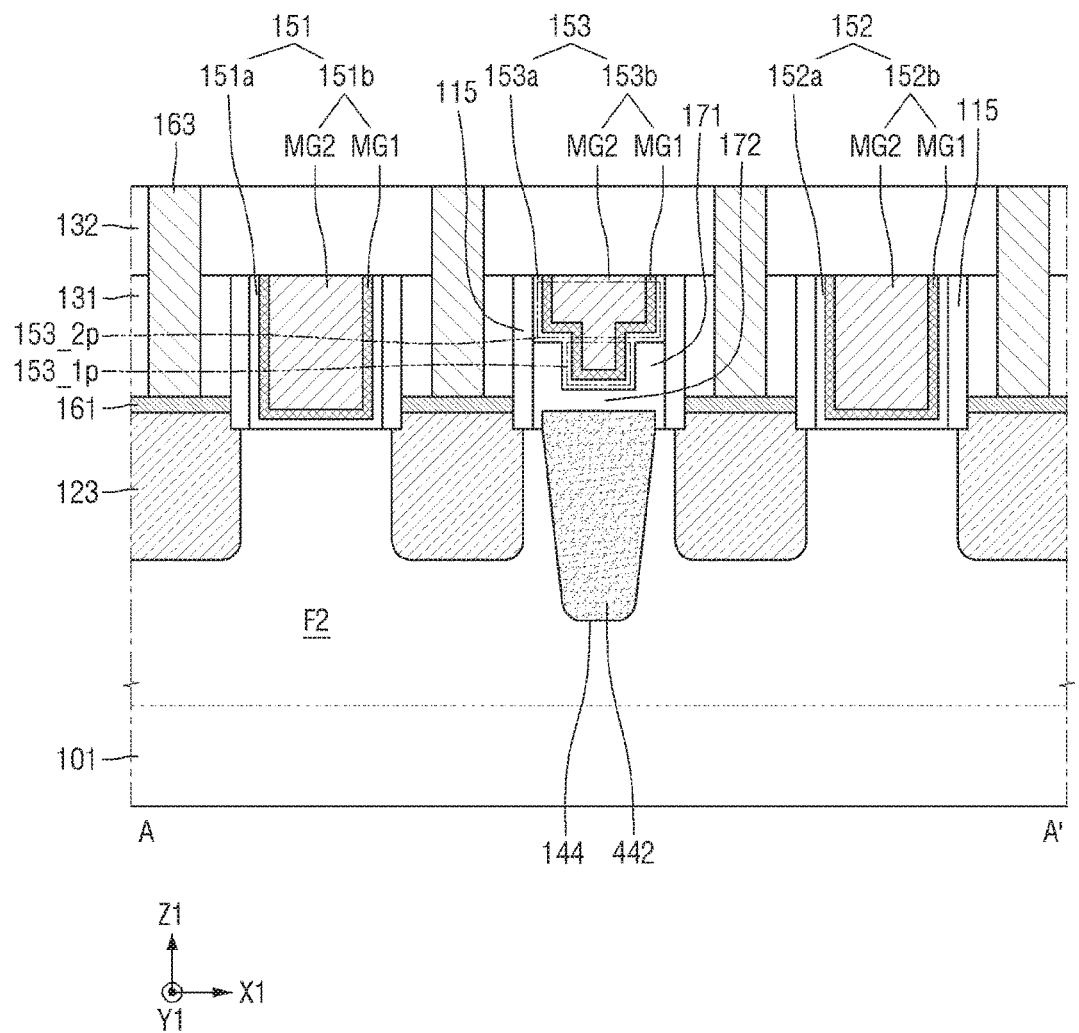
FIG. 23 is a cross-sectional view illustrating a semiconductor device according to some example embodiments.

FIG. 23 is a cross-sectional view illustrating a semiconductor device according to at least one example embodiment and taken along line A-A' of FIG. 1.

Referring to FIG. 23, a semiconductor device may include a device isolation region (or device isolation layer) 442 without a capping layer according to at least one example embodiment.

The device isolation region 442 may include and/or may be formed from, for example, silicon oxide, etc. In some example embodiments, the device isolation region 442 may include and/or may be formed from, for example, silicon nitride, silicon carbide, silicon oxycarbide, silicon oxynitride, and/or silicon oxycarbonitride, etc.

Figure 24:
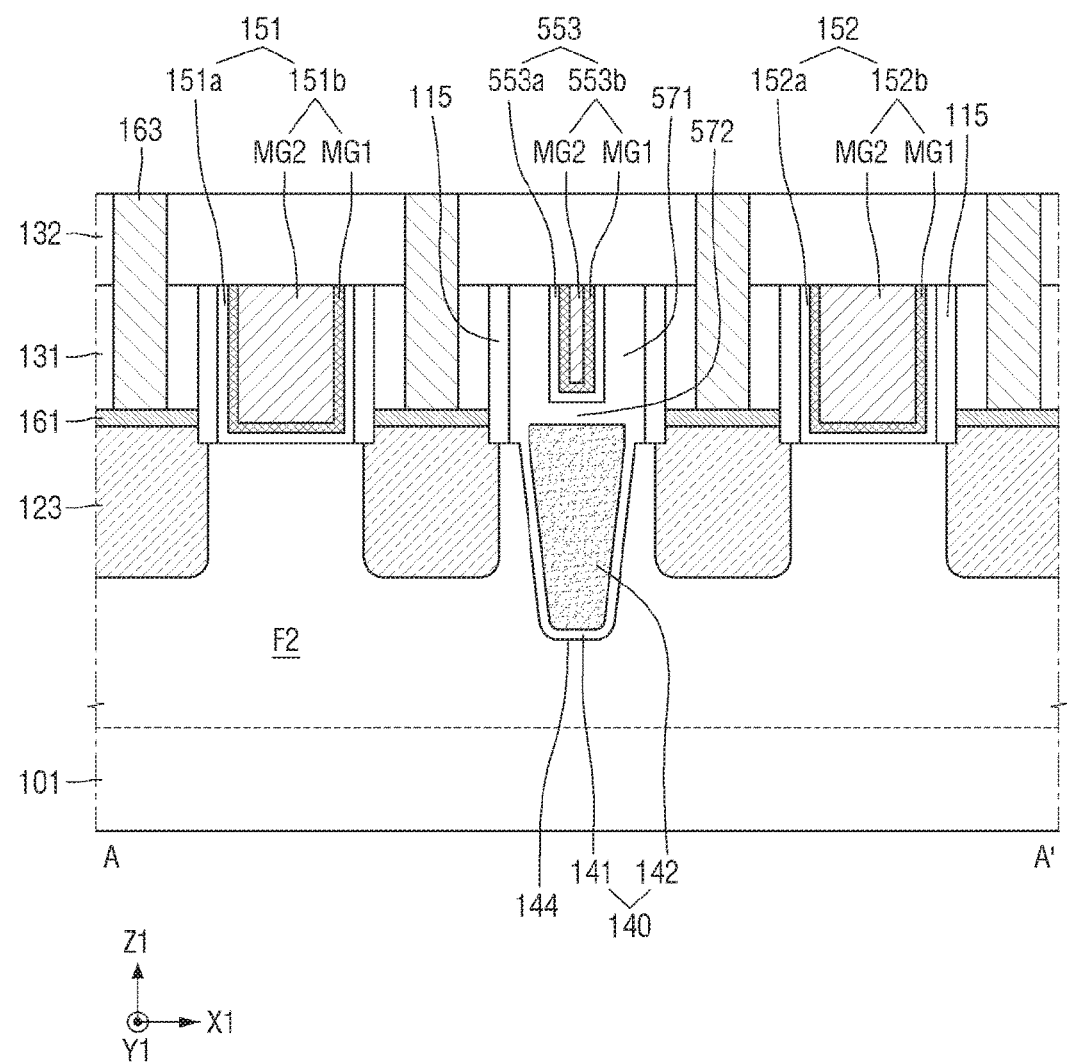
FIG. 24 is a cross-sectional view illustrating a semiconductor device according to some example embodiments.

FIG. 24 is a cross-sectional view illustrating a semiconductor device according to at least one example embodiment and taken along line A-A' of FIG. 1.

Referring to FIG. 24, a semiconductor device may include a plurality of first inner spacers 571 and a dummy gate structure 553 each having respective upper surfaces that are coplanar and/or substantially coplanar with each other.

In the semiconductor device shown in FIG. 24, a sidewall and a lower surface of a dummy gate insulating layer 553a may be fully surrounded by the plurality of first inner spacers 571 and a second inner spacer 572, and a dummy gate electrode 553b may fill a space defined by the dummy gate insulating layer 553a, when compared to the semiconductor device shown in FIG. 2.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A semiconductor device comprising:
   at least one fin protruding from a substrate and extending in a first direction;
   a plurality of source/drain regions on the at least one fin;
   a recess region being between the plurality of source/drain regions;
   a device isolation region including a capping layer and a device isolating layer, the capping layer extending along an inner surface of the recess region and the device isolating layer on the capping layer to fill the recess region;
   a dummy gate structure on the device isolation region, the dummy gate structure extending in a second direction different from the first direction, and the dummy gate structure including a dummy gate insulating layer;
   a plurality of outer spacers on opposite sidewalls of the dummy gate structure;
   a plurality of first inner spacers being between the dummy gate structure insulating layer and the plurality of outer spacers; and
   a second inner spacer being between the device isolation region and the dummy gate insulating layer, and the second inner spacer being between the plurality of first inner spacers and spaced apart from the capping layer, wherein
   the plurality of first inner spacers overlap vertically with a part of the dummy gate structure, and
   a width of the second inner spacer is smaller than a width of an upper surface of the dummy gate structure.

2. The semiconductor device according to claim 1, wherein a thickness of each of the plurality of first inner spacers is greater than a thickness of the capping layer.

3. The semiconductor device according to claim 1, wherein the dummy gate structure further includes a metal layer on the dummy gate insulating layer.

4. The semiconductor device according to claim 1, wherein
   the capping layer includes a first surface and a second surface, the second surface opposite the first surface and the first surface contacting the at least one fin;
   the device isolation layer is on the second surface of the capping layer; and
   a portion of each of the plurality of first inner spacers protrudes further laterally than the second surface of the capping layer.

5. The semiconductor device according to claim 1, wherein an upper surface of the device isolation layer is higher than an upper surface of the at least one fin.

6. The semiconductor device according to claim 1, wherein an upper surface of the device isolation layer is substantially coplanar with an upper surface of the at least one fin.

7. The semiconductor device according to claim 1, wherein the capping layer, the plurality of first inner spacers, and the second inner spacer include at least one same material; and the material of each of the capping layer, the plurality of first inner spacers, and the second inner spacer includes at least one material different from the device isolation layer.

8. The semiconductor device according to claim 1, further comprising:

a first gate structure and a second gate structure located on opposite sides of the dummy gate structure, wherein the first gate structure and the second gate structure each extend in the second direction.

9. The semiconductor device according to claim 8, wherein upper surfaces of the plurality of first inner spacers are disposed lower than upper surfaces of the first and second gate structures.

10. The semiconductor device according to claim 1, wherein upper surfaces of the plurality of outer spacers are substantially coplanar with upper surfaces of the plurality of first inner spacers.

11. A semiconductor device comprising:

at least one fin protruding from a substrate and extending in a first direction;

a first gate structure and a second gate structure on the at least one fin and extending in a second direction intersecting the first direction;

a recess region, on the at least one fin, and being between the first gate structure and the second gate structure;

a device isolation region in the recess region;

a plurality of outer spacers being between the first gate structure and the second gate structure;

a plurality of first inner spacers on corresponding sidewalls of the plurality of outer spacers, and the plurality of first inner spacers being between a dummy gate insulating layer and the plurality of outer spacers;

a second inner spacer connecting the plurality of first inner spacers; and a dummy gate structure being between the plurality of outer spacers and on the plurality of first inner spacers and the second inner spacer, the dummy gate structure including a first portion and a second portion, the first portion being between the plurality of first inner spacers, and the second portion on the first portion and upper surfaces of the plurality of first inner spacers, the dummy gate structure including the dummy gate insulating layer, wherein a bottommost surface of the first portion is higher than a topmost surface of the at least one fin, the plurality of first inner spacers overlap vertically with a part of the dummy gate structure, and a width of the second inner spacer is smaller than a width of an upper surface of the dummy gate structure.

12. The semiconductor device according to claim 11, wherein the dummy gate structure further includes a metal layer, the metal layer on the dummy gate insulating layer; and the dummy gate insulating layer includes at least a high-k dielectric material.

13. The semiconductor device according to claim 11, wherein the device isolation region includes a capping layer and a device isolation layer, the device isolation layer on the capping layer;

the capping layer extends along an inner surface of the recess region; and the device isolation layer fills the recess region.

14. The semiconductor device according to claim 13, wherein a width of the first portion of the dummy gate structure is less than a width of the device isolation layer.

15. The semiconductor device according to claim 11, wherein a width of the second portion of the dummy gate structure is greater than a width of the first portion thereof.

16. A semiconductor device comprising:

at least one fin protruding from a substrate and extending in a first direction;

a first gate structure and a second gate structure on the at least one fin, the first gate structure and the second gate structure both extending in a second direction intersecting the first direction;

a recess region on the at least one fin and being between the first gate structure and the second gate structure;

a device isolation layer in the recess region;

a dummy gate structure on the device isolation layer and including a dummy gate insulating layer;

a plurality of outer spacers on opposite sidewalls of the dummy gate structure; and a dielectric layer including a plurality of first parts, a second part, and a third part, the plurality of first parts each on portions of corresponding sidewalls of the plurality of outer spacers, the second part being between the device isolation layer and the dummy gate insulating layer and connected to the plurality of first parts, and the third part being between the device isolation layer and an inner surface of the recess region, wherein the plurality of first parts overlap vertically with a part of the dummy gate structure, and a width of the second part is smaller than a width of an upper surface of the dummy gate structure.

17. The semiconductor device according to claim 16, wherein the device isolation layer and the dielectric layer include different materials from each other.

18. The semiconductor device according to claim 17, wherein the dielectric layer includes at least nitride, and the device isolation layer includes at least oxide.

19. The semiconductor device according to claim 16, wherein the dummy gate structure includes a first portion and a second portion, the first portion being between the plurality of first parts of the dielectric layer, and the second portion on the first portion and upper surfaces of the plurality of first parts of the dielectric layer.

20. The semiconductor device according to claim 19, wherein a width of the second portion of the dummy gate structure is greater than a width of the first portion thereof.

* * * * *